United States Patent [19]
Kotani et al.

[11] Patent Number: 5,719,531
[45] Date of Patent: Feb. 17, 1998

[54] DATA TRANSMISSION CIRCUIT, DATA LINE DRIVING CIRCUIT, AMPLIFYING CIRCUIT, SEMICONDUCTOR INTEGRATED CIRCUIT, AND SEMICONDUCTOR MEMORY

[75] Inventors: Hisakazu Kotani, Hyogo; Hironori Akamatsu, Osaka; Toshio Yamada, Osaka; Akihiro Sawada, Osaka; Hirohito Kikukawa, Osaka; Masashi Agata, Osaka; Shunichi Iwanari, Osaka, all of Japan

[73] Assignee: Matsushita Electric Industrial Co.Ltd., Osaka, Japan

[21] Appl. No.: 739,841

[22] Filed: Oct. 30, 1996

Related U.S. Application Data

[62] Division of Ser. No. 573,133, Dec. 15, 1995, abandoned, which is a division of Ser. No. 260,922, Jun. 15, 1994, Pat. No. 5,515,334.

[30] Foreign Application Priority Data

Jun. 17, 1993 [JP] Japan ................................. 5-145938
Oct. 15, 1993 [JP] Japan ................................. 5-258070

[51] Int. Cl.⁶ ........................................................ H03F 3/45
[52] U.S. Cl. ........................................... 330/297; 330/261
[58] Field of Search ............................. 330/69, 252, 253, 330/261, 297; 323/271, 282

[56] References Cited

U.S. PATENT DOCUMENTS

| | | | |
|---|---|---|---|
| 3,478,275 | 11/1969 | Walker | 330/297 |
| 4,507,619 | 3/1985 | Dijkstra et al. | 330/297 |
| 4,808,905 | 2/1989 | Chen et al. | 323/285 X |
| 5,010,303 | 4/1991 | Braun | 330/259 X |
| 5,450,036 | 9/1995 | Nishioka et al. | 330/297 X |

*Primary Examiner*—Steven Mottola
*Attorney, Agent, or Firm*—McDermott, Will & Emery

[57] ABSTRACT

In a driver circuit for driving a pair of data lines, the amplitude of a differential input signal is reduced from 2.5 V to 0.6 V, which is smaller than a conventional lower-limit source voltage (approximately 1.5 V). The amplitude of the differential signal transmitted through the pair of data lines is amplified to 2.5 V by an amplifying circuit and the resulting signal is then latched by a latch circuit. After the latching by the latch circuit, the operation of the amplifying circuit is halted. The driver circuit is constituted solely by a plurality of NMOS transistors so as not to increase a leakage current flowing in the off state. Here, the threshold voltage of the NMOS transistor positioned on the ground side is reduced to a conventional lower-limit value (0.3 V to 0.6 V), while the threshold voltage of the NMOS transistor on the power-source side to a value lower than the above lower-limit value (0 V to 0.3 V), thereby enhancing a driving force of the NMOS transistor on the power-source side.

2 Claims, 18 Drawing Sheets

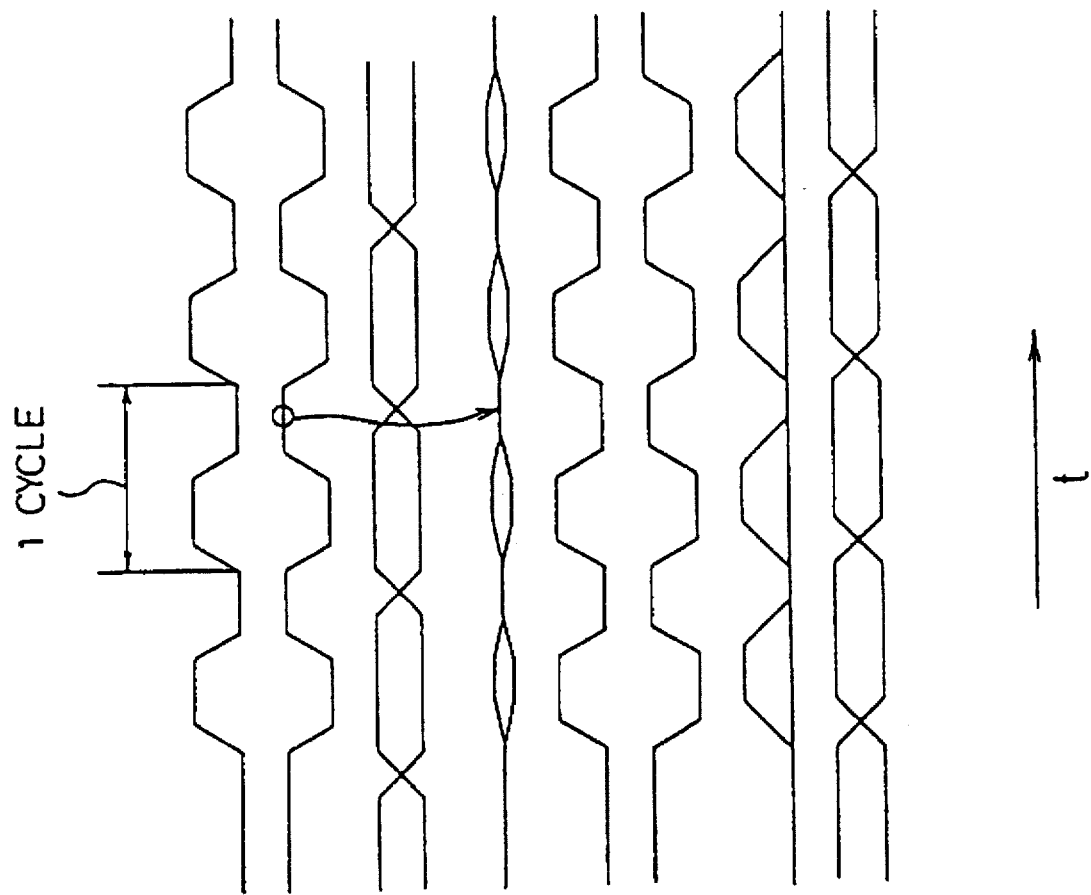

$t_c = 20ns / 16bit$
$VINTL = 0.6V$
$RL = 1.8k\Omega$
$CL = 4.5pF$
Fig.14(a) IN/XIN 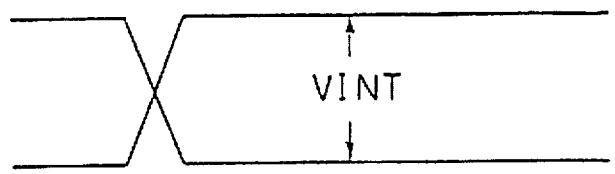
Fig.14(b) CONT/XCONT CONT1 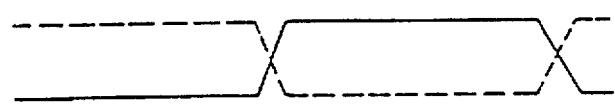
Fig.14(c) CONT1a 
Fig.14(d) EQ 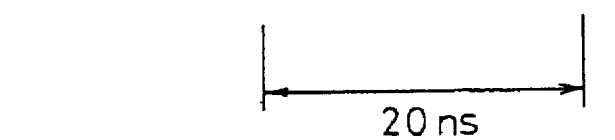
20 ns

DATA TRANSMISSION CIRCUIT, DATA LINE DRIVING CIRCUIT, AMPLIFYING CIRCUIT, SEMICONDUCTOR INTEGRATED CIRCUIT, AND SEMICONDUCTOR MEMORY

This is a Divisional of application Ser. No. 08/573,133, filed Dec. 15, 1995, now abandoned, which is a Divisional of application Ser. No. 08/260,922 filed Jun. 15, 1994, now U.S. Pat. No. 5,515,334, issued May 7, 1996.

BACKGROUND OF THE INVENTION

The present invention relates to a data transmission circuit, data line driving circuit and amplifying circuit for use in the data transmission circuit, and semiconductor integrated circuit and semiconductor memory each of which comprises the data transmission circuit.

In recent years, the capacity of a dynamic RAM (DRAM), which is among semiconductor integrated circuits (LSI), has been increasing at a rate of quadrupling in three years. With the increasing capacity, the chip area of the DRAM has also multiplied 1.5-fold between every adjacent generations (e.g., between the 1M-bit and 4M-bit generations). With the increasing chip area, the wire length of signal lines for transmitting data in the DRAM has also increased, thus inviting an increase in wiring capacitance. Furthermore, an increase in the number of wired signal lines due to a tendency of the DRAM toward a multi-bit configuration has also spurred the increase in wiring capacitance.

In the DRAM, charging and discharging of the signal lines accounts for the most part of its power consumption. The above increase in wiring capacitance in turn increases a charging and discharging current and eventually brings about an increase in the total power consumption of the DRAM. The increase in wiring capacity also induces an increase in signal delay.

With the increasing miniaturization of a MOS transistor element in the DRAM, a voltage-withstand ability of its oxide film has also raised a problem.

To overcome the problem, there has been an effort to reduce an internal source voltage in a conventional DRAM in order to improve the reliability of the oxide film as well as reduce the power consumption and signal delay. In the conventional DRAM, a reduced voltage VINT which was generated inside a DRAM chip based on an external source voltage VCC is supplied to a transistor circuit on the chip.

Reducing the voltage amplitude of a signal line is extremely effective in reducing the total power consumption of an LSI: Japanese Laid-Open Patent Publication No. 4-211515 discloses a data transmission circuit which operates with a small amplitude based on an internal source voltage that has been reduced (reduced voltage). In the data transmission circuit, a driver circuit composed of CMOS transistors drives a single data line for transmitting data with a small amplitude. A receiver circuit, as shown in FIG. 18, receives a signal having a small amplitude from the data line and converts it to a signal having a larger amplitude.

However, the conventional data transmission circuit mentioned above is disadvantageous in that, if a wire for transmitting data becomes considerably long, an input IN of the receiver circuit shown in FIG. 18 changes only slowly, resulting in a lower operating speed. This is because the receiver circuit will not operate till the input IN thereof reaches (VCL-Vtn) or (VSL-Vtp) and that it is composed of a source-follower circuit, so that Vtn and Vtp are increased due to a body effect. In addition, the conventional data transmission circuit requires two power supplies VCL and VSL, which causes an increase in power consumption accordingly.

To increase the operating speed, it is possible to compose the input part of the receiver circuit of an NMOS and PMOS, each having lower Vtn and Vtp. In order to reduce the threshold voltages of the MOS transistors, however, more steps and more masks are needed in their fabrication processes. To reduce the transition time of a signal inputted to the receiver circuit, it can also be considered to provide a CMOS inverter in the upper stage of the receiver circuit, which disadvantageously generates a leakage current between the VCL and VSL in the off state.

SUMMARY OF THE INVENTION

The present invention has been achieved in view of the foregoing. It is therefore an object of the present invention to implement higher-speed data transmission consuming lower power even if a long wire is installed.

To attain the above object, a data transmission circuit for use in a semiconductor integrated circuit according to the present invention comprises, as shown in FIG. 6: a first circuit (driver circuit) 6a for converting a first pair of differential signals, each having a first amplitude, to a second pair of differential signals, each having a second amplitude smaller than the above first amplitude; a pair of signal lines (pair of data lines) 20 for transmitting the second pair of differential signals obtained through the conversion by the above first circuit 6a; a second circuit (amplifying circuit) 30 for converting the second pair of differential signals transmitted through the above pair of signal lines 20 to a third pair of differential signals, each having a third amplitude; and a third circuit (latch circuit) 40 for latching the third pair of differential signals obtained through the conversion by the above second circuit 30.

With the above structure, data transmission through the pair of data lines 20 can be implemented by means of the second pair of differential signals, each having a voltage amplitude smaller than that of the first pair of differential signals (pair of differential input signals). Consequently, even when the wire length of the pair of data lines 20 is large, the influence on data transmission of the parasitic resistance and parasitic capacitance of the pair of data lines 20 on data transition can be suppressed as well as a charging and discharging current and signal delay can be reduced, thus realizing a semiconductor integrated circuit which operates at a high speed and consumes lower power. Moreover, since a peak current can be reduced due to the reduced charging and discharging current, the reliability and noise resistance of signal lines can be improved. Furthermore, since the third circuit 40 is provided in the lower stage of the second circuit 30, the output load on the second circuit 30 is reduced so that the second circuit 30 can be reduced in size, thereby suppressing a current flowing from a power-source terminal to a ground terminal.

Preferably, in the above data transmission circuit, a ground line of the above first circuit is provided independently of ground lines of other circuits in the above semiconductor integrated circuit. With the above structure, a stable operation is ensured for the first circuit without being affected by a variation in the ground level due to the operation of the other circuits.

Preferably, in the above data transmission circuit, the operation of the above second circuit is halted in synchronization with the latching of the above third pair of differential signals by the above third circuit. With the above structure, power consumption of the semiconductor integrated circuit can further be reduced.

Preferably, the above data transmission circuit further comprises, as shown in FIG. 11, a fourth circuit (equalizing circuit) 60 for equalizing the potentials of the above pair of signal lines (pair of data lines) 20. With the above structure, the time required for a potential difference between the pair of signal lines 20 to reach a specified value is shortened, so that data transmission is performed at a higher speed.

To attain the above object, a data line driving circuit (driver circuit) 6a for differentially driving a pair of data lines 20 in a semiconductor integrated circuit according to the present invention comprises, as shown in FIG. 6: a pair of differential input terminals 11 and 12 for accepting a first pair of differential signals each having a first amplitude; a pair of differential output terminals 14 and 15 connected to the above pair of data lines 20 so as to output a second pair of differential signals each having a second amplitude; a first NMOS transistor Qn11 having a gate connected to one terminal 11 of the above pair of differential input terminals 11 and 12, a drain connected to one terminal 14 of the above pair of differential output terminals 14 and 15, and a source connected to a power source line; a second NMOS transistor Qn12 having a gate connected to the other terminal 12 of the above pair of differential input terminals 11 and 12, a drain connected to the drain of the above first NMOS transistor Qn11, and a source connected to a ground line; a third NMOS transistor Qn13 having a gate connected to the gate of the above second NMOS transistor Qn12, a drain connected to the other terminal 15 of the above pair of differential output terminals 14 and 15, and a source connected to the above power source line; and a fourth NMOS transistor Qn14 having a gate connected to the gate of the above first NMOS transistor Qn11, a drain connected to the drain of the above third NMOS transistor Qn13, and a source connected to the above ground line.

With the above structure in which the data line driving circuit 6a is composed of the NMOS transistors, a large voltage can be obtained between the gate and source of each of the NMOS transistors Qn11 to Qn14. Even when the lower-limit value of the threshold voltages of the NMOS transistors is constrained to 0.3 V to 0.6 V, a large force to drive the pair of signal lines can be obtained, so that high-speed data transmission can be implemented with a voltage amplitude smaller than 1.5 V without increasing leakage currents flowing in the off state. Moreover, the data line driving circuit 6a according to the present invention requires only one power source, whereas a conventional data line driving circuit composed of CMOS transistors requires two power sources, so that power consumption of the semiconductor integrated circuit can further be reduced. Furthermore, since the data line driving circuit can be composed solely of the NMOS transistors, it can be fabricated easily.

Preferably, in the above data line driving circuit 6a, the threshold voltages of the above first and third NMOS transistors Qn11 and Qn13 are lower than the threshold voltages of the above second and fourth NMOS transistors Qn12 and Qn14. With the above structure, even when the threshold voltages of the first and third NMOS transistors Qn11 and Qn 13 positioned on the power-source side are set to a value lower than a conventional lower-limit value (approximately 0.3 to 0.6 V), leakage currents flowing through the Qn11 and Qn13 in the off state are prevented by the second and fourth NMOS transistors Qn12 and Qn14 positioned on the ground side. Consequently, by setting the threshold voltages of the Qn11 and Qn13 lower than the threshold voltages of the Qn12 and Qn14, the driving forces of the Qn11 and Qn13 can further be enhanced without increasing the leakage currents flowing in the off state.

To attain the above object, an amplifying circuit for amplifying a pair of differential signals inside a semiconductor integrated circuit according to the present invention comprises, as shown in FIG. 17: a pair of differential input terminals 31 and 32 for accepting the above pair of differential signals; an amplifier 36 for amplifying the pair of differential signals inputted via the above pair of differential input terminals 31 and 32; a pair of differential output terminals 34 and 35 for outputting the pair of differential signals which have been amplified by the above amplifier 36; and a power source controller 37 for controlling power supply to the above amplifier 36 based on outputs from the above pair of differential output terminals 34 and 35.

With the above structure, power supply to the above amplifier 36 is controlled based not on the pair of differential input signals, each having the smaller amplitude, but on the pair of differential output signals which have been amplified by the amplifier 36. Consequently, the operation of the amplifier 36 can surely be halted, thereby further reducing the power consumption of the semiconductor integrated circuit.

Preferably, in the above amplifying circuit, the above power source controller 37 comprises, as shown in FIG. 17, first and second PMOS transistors Qp37 and Qp38 which are connected in series to each other and which are interposed between a power source line and the above amplifier 36, wherein the above first PMOS transistor Qp37 has its gate connected to one terminal 35 of the above pair of differential output terminals 34 and 35, and the above second PMOS transistor Qp38 has its gate connected to the other terminal 34 of the above pair of differential output terminals 34 and 35. With the above structure, since outputs are the pair of differential signals, at least either of the first and second PMOS transistors Qp37 and Qp38 constituting the power source controller 37 is surely turned off.

To attain the above object, a semiconductor integrated circuit according to the present invention comprises, as shown in FIG. 9: a main source wiring system 56 and a subordinate source wiring system 57, each having a power source line and a ground line; a first circuit block 51 connected directly to the above main source wiring system 56; a second circuit block 52 connected directly to the above subordinate source wiring system 57; and a source-system coupled circuit 70 interposed between the above main source wiring system 56 and subordinate source wiring system 57 so as to prevent noise propagation from the above first circuit block 51 to the above second circuit block 52.

With the above structure, the source-system coupled circuit 70 interposed between the main source wiring system 56 and subordinate source wiring system 57 suppresses the noise propagation from the first circuit block 51 to the second circuit block 52.

Preferably, in the above semiconductor integrated circuit, the above source-system coupled circuit 70 comprises, as shown in FIG. 9, first and second NMOS transistors Qn71 and Qn72 which are connected in parallel to each other and which are interposed between the ground line of the above main source wiring system 56 and the ground line of the above subordinate source wiring system 57, the above first NMOS transistor Qn71 has its gate supplied with a control clock, and the above second NMOS transistor Qn72 has its gate connected to the ground line of the above subordinate source wiring system 57. With the above structure, if the first NMOS transistor Qn71, which is one of the two NMOS transistors Qn71 and Qn72 constituting the source-system coupled circuit 70, is turned on in response to the control clock, the ground line 56 for the main source wiring system is connected to the ground line 57 for the subordinate source wiring system with a low impedance. While the first NMOS transistor Qn71 is in the off state, the second NMOS transistor Qn72 functions as a MOS diode for preventing the noise propagation from the ground line 56 for the main source wiring system to the ground line 57 for the subordinate source wiring system. Consequently, even when the second circuit block 52 has a driver circuit which handles the above pair of differential signals, each having the smaller voltage amplitude, the malfunction thereof can be prevented.

To attain the above object, a first semiconductor memory according to the present invention comprises, as shown in FIG. 1 or FIG. 2: a data processing unit 3 and at least one memory unit 2 disposed on a single semiconductor chip 1; and a pad 4 disposed on the above semiconductor chip 1 so as to perform at least either of the inputting of a signal from the outside of the semiconductor chip 1 or the outputting of a signal to the outside thereof, the above pad 4 being disposed between that portion of the above semiconductor chip 1 in which the above memory unit 2 is disposed and that portion of the above semiconductor chip 1 in which the above data processing unit 3 is disposed.

With the above structure, since the memory unit 2 and data processing unit 3 are provided on the same semiconductor chip 1, a conventional data exchange between a memory chip and a data processing chip becomes unnecessary, so that the data transmission speed can be increased easily, thus providing a data processing system that is simple and densely packed. Moreover, since it is unnecessary to provide a data bus for connecting the memory chip to the data processing chip on the board, a current for driving the data bus on the board can be saved, thereby reducing power consumption of the data processing system. In addition, since the pad 4 is disposed at precisely the midpoint between the memory unit 2 and data processing unit 3, the lengths of wires connecting the pad 4 to the memory unit 2 and connecting the pad 4 to the data processing unit 3 can be reduced. As a result, a delay in the operating speed can be prevented. Furthermore, since a wired region can be reduced, an increase in chip area can be prevented and an input capacitance of a signal line terminal viewed from the outside can also be reduced. Consequently, a simple data processing system which allows high-speed processing can be constituted and an optimum layout in a semiconductor chip can be achieved.

Preferably, in the above first semiconductor memory provided with a plurality of memory units 2, as shown in FIG. 1, the above data processing unit 3 is disposed in the central portion of the above semiconductor chip 1, the above plurality of memory units 2 are disposed in the marginal portion of the above semiconductor chip 1, and the above pad 4 is disposed in the intermediate portion positioned between the central portion and marginal portion of the above semiconductor chip 1. With the above structure, the data processing unit 3 is disposed in the central portion of the semiconductor chip I and the plurality of memory units 2 are disposed in the marginal portion of the semiconductor chip 1, so that the lengths of wires connecting the memory units 2 to the data processing unit 3 are equal. Consequently, and undesired reduction in the operating speed which results from the access of the processing unit 3 to a specific memory unit 2 can be prevented.

To attain the above object, a second semiconductor memory according to the present invention comprises, as shown in FIG. 3(a) and 3(b): a memory array 122 and data processing unit 3 disposed on a single semiconductor chip 1; a source voltage terminal (source voltage pad) 125 disposed on the above semiconductor chip 1 so as to supply a source voltage to the above memory array 122 and data processing unit 3; a ground voltage terminal (ground voltage pad) 126 disposed on the above semiconductor chip 1 so as to supply a ground voltage to the above memory array 122 and data processing unit 3; a memory array supply voltage generating circuit (reference voltage generating circuit) 127 disposed on the above semiconductor chip 1 so as to receive the source voltage from the above source voltage terminal 125 and the ground voltage from the above ground voltage terminal 126 and generate a memory array supply voltage to be supplied to the above memory array 122; and a means for cutting off a current (switching element) 129 disposed on the above semiconductor chip 1 so as to cut off a current flowing from the above source voltage terminal 125 through the above memory array supply voltage generating circuit 127 to the above ground voltage terminal 126.

With the above structure, in the case of inspecting a source current flowing through the data processing unit 3 on standby, a current flowing from the source voltage terminal 125 through the memory array supply voltage generating circuit 127 to the ground voltage terminal 126 can be cut off by the means for cutting off a current 129, so that a source current failure during standby can be detected in the data processing unit 3. Consequently, a simple data processing system which allows high-speed data processing can be constituted as well as an effective inspection can be executed with respect to a source current during standby.

To attain the above object, a third semiconductor memory according to the present invention comprises, as shown in FIGS. 5(a) and 5(b): a memory array 122 and data processing unit 3 disposed on a single semiconductor chip 1; a first source voltage terminal (first source voltage pad) 125a disposed on the above semiconductor chip 1 so as to supply a source voltage to the above memory array 122; a second source voltage terminal (second source voltage pad) 125b disposed on the above semiconductor chip 1 so as to supply the source voltage to the above data processing unit 3; and a memory array supply voltage generating circuit (reference voltage generating circuit) 127 disposed on the above semiconductor chip 1 so as to receive the source voltage from the above first source voltage terminal 125a and generate a memory array supply voltage to be supplied to the above memory array 122.

In the above structure, there are provided: the first source voltage terminal 125a for supplying the source voltage to the memory array 122 and memory array supply voltage generating circuit 127; and the second source voltage terminal 125b for supplying the source voltage to the data processing unit 3. As a result, a current flows from the first source voltage terminal 125a into the memory array supply voltage generating circuit 127 and does not affect a current flowing from the second source voltage terminal 125b into the data processing unit 3. In the case of inspecting a source current during standby, therefore, the measurement of the source current flowing through the memory array 122 on standby can be performed independently of the measurement of the source current flowing through the data processing unit 3 on standby, so that it is also possible to detect a source current failure in the data processing unit 3 on standby. Moreover, since the control signal for controlling the means for cutting off a current (switching element), which was required in the above second semiconductor memory), is not required, control over the chip can be simplified. Consequently, a simple data processing system which allows high-speed data processing can be constituted as well as an effective inspection can be executed with respect to a source current during standby.

BRIEF DESCRIPTION OF THE DRAWINGS

FIGS. 12(a), 12(b), 12(c), 12(d), 12(e), 12(f), 12(g) and 12(h) are timing charts showing the operation of the data transmission circuit according to a second embodiment;

FIGS. 14(a), 14(b), 14(c) and 14(d) are timing charts showing conditions for a simulation in the circuits of FIGS. 13(a) to 13(c);

DETAILED DESCRIPTION OF THE PREFERRED EMBODIMENTS

First Embodiment

Below, a first embodiment of the present invention will be described with reference to the drawings.

Figure 1:
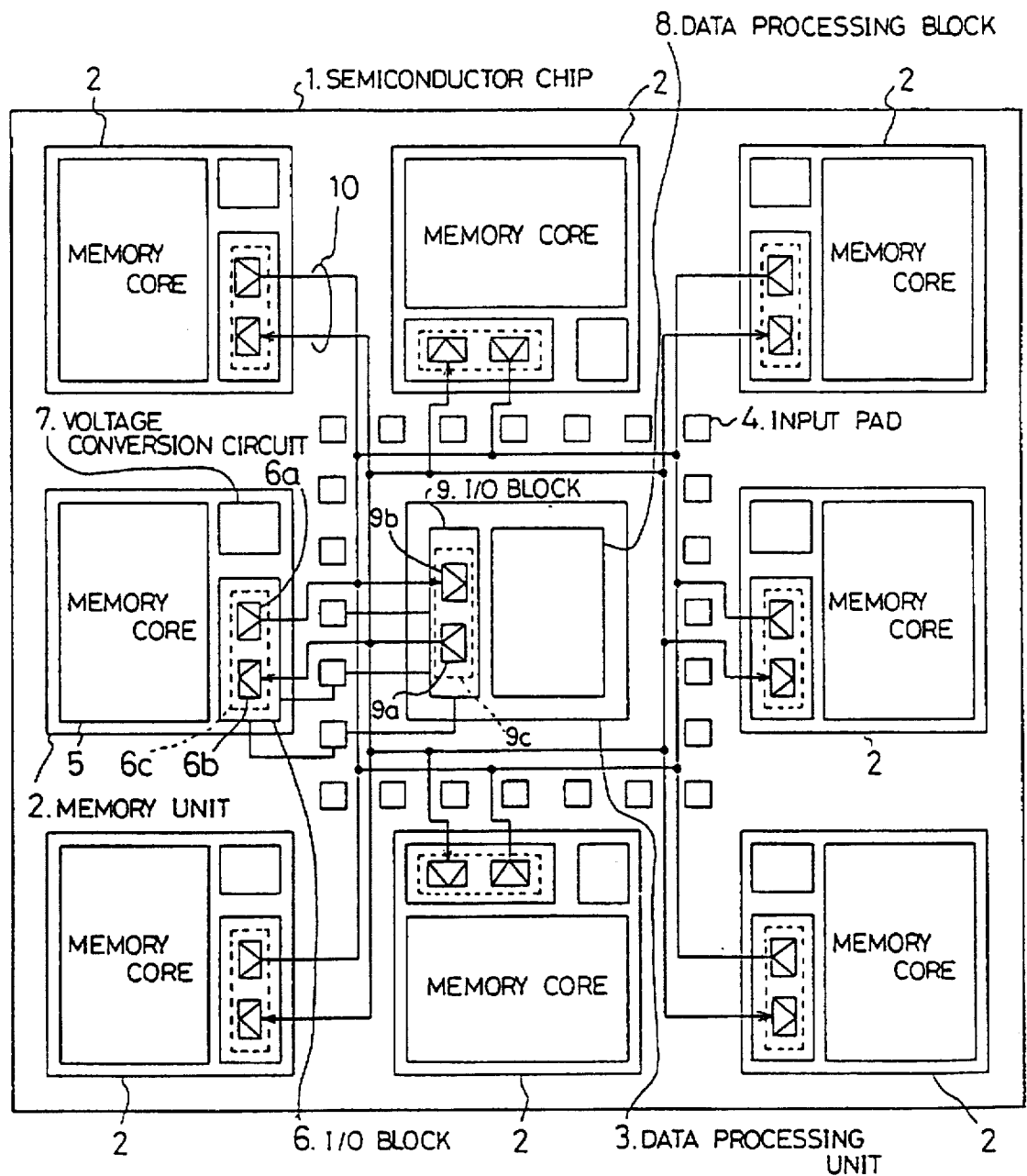
FIG. 1 is a layout diagram showing an example of a DRAM according to a first embodiment of the present invention.

FIG. 1 is a view showing a DRAM according to the first embodiment, in which eight memory units 2 and a data processing unit 3 are provided on a semiconductor chip 1. The data processing unit 3 is disposed in the central portion of the semiconductor chip 1, while the eight memory units 2 are disposed in the marginal portion of the semiconductor chip 1 so as to surround the data processing unit 3. In the intermediate portion between the central portion and marginal portion of the semiconductor chip 1 are disposed a plurality of input pads 4 for accepting an external signal. The intermediate portion also serves as a wired region in which wires for interconnecting the memory units 2, data processing unit 3, and input pads 4 (the drawing thereof is omitted with some exceptional parts).

In the DRAM in which the memory units 2, data processing unit 3, and input pads 4 are disposed on the semiconductor chip 1, the operation between the memory units 2 and data processing unit 3 is free from an undesired speed reduction resulting from the access of the data processing unit 3 to a specified memory unit 2, since the distances between the individual memory units 2 and the data processing unit 3 on the semiconductor chip 1 are the same. The operation between the memory units 2 or data processing unit 3 and the outside of the semiconductor chip 1 is also free from a speed reduction, since the input pads 4 are positioned precisely at the midpoints between the memory units 2 and data processing unit 3 and hence it is possible to reduce the length of a wire connecting the input pad 4 to the memory unit 2 and the length of a wire connecting the input pad 4 to the data processing unit 3. Moreover, since the wired region can be reduced, an increase in chip area and the input capacitance of a signal line terminal viewed from the outside of the semiconductor chip 1 can also be reduced advantageously.

Each of the memory units 2 comprises: a memory core 5 including a memory array, decoder circuit, control circuit, and the like; an I/O block 6; and a voltage conversion circuit 7 for generating an internal source voltage to be used inside the memory unit 2. The I/O block 6 has a data transfer element 6c for executing bilateral data transfer between the memory unit 2 and data processing unit 3 via a data bus 10. The data transfer element 6c consists of: a driver circuit 6a for sending data to the data bus 10 so that the data is transferred to the data processing unit 3; and a receiver circuit 6b for receiving from the data bus 10 the data sent from the data processing unit 3.

The data processing unit 3 comprises: a data processing block 8 for performing intrinsic data processing; and an I/O block 9 having a data transfer element 9c which consists of a driver circuit 9a and a receiver circuit 9b, similarly to the memory unit 2.

In the present embodiment, although data transfer is performed only between the data processing unit 3 and each of the memory units 2, it is possible to exchange data between the memory units 2. It is also possible to constitute the pad 4 so that it not only accepts an external signal but also outputs a signal generated inside the DRAM to the outside.

Figure 2:
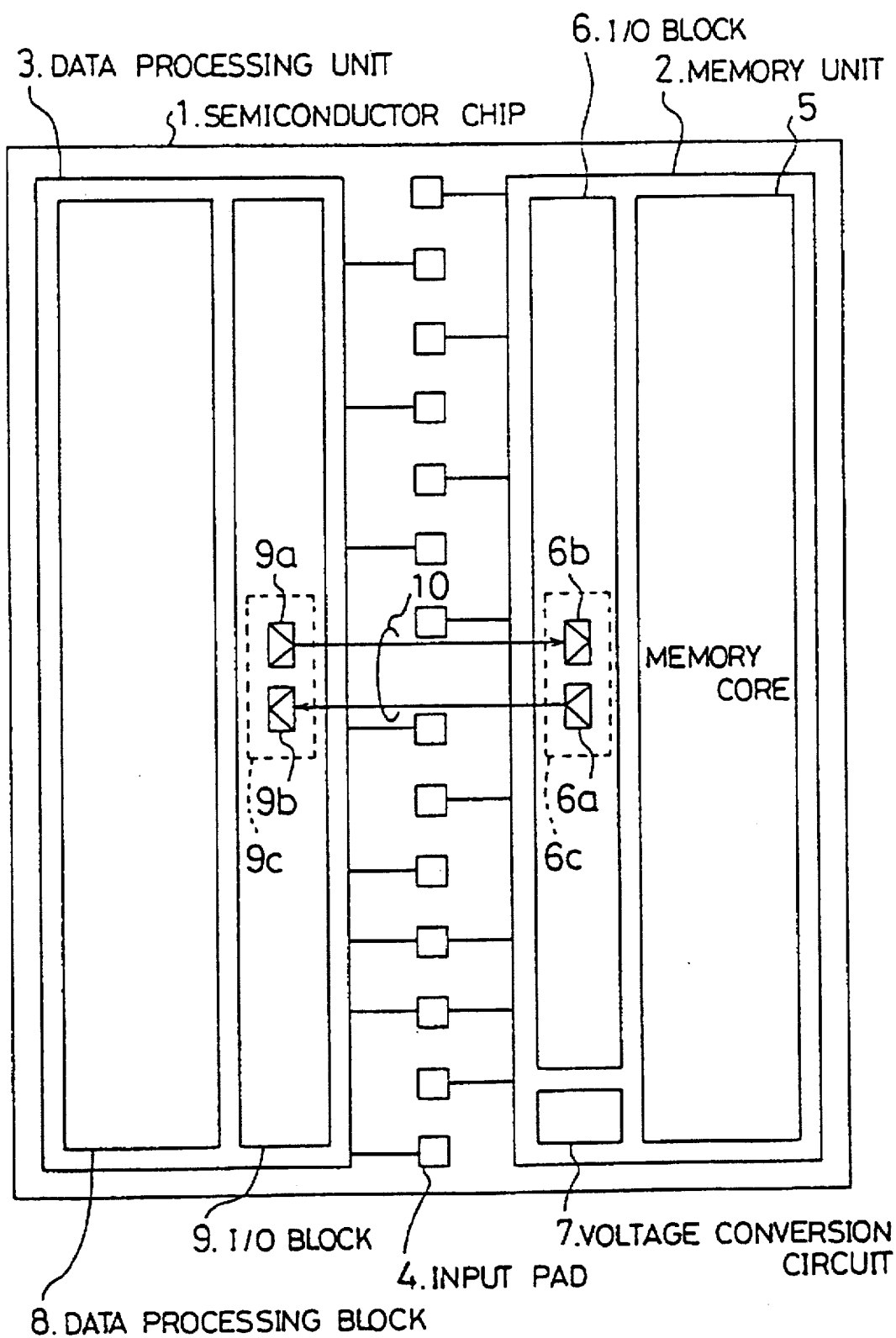
FIG. 2 shows another layout diagram showing another example of the DRAM in which the components are placed differently.

FIG. 2 is a view showing another example of the layout of the components of the DRAM. A description of the same components as shown in FIG. 1 is omitted here by providing the same reference numerals. As shown in FIG. 2, it is possible to provide the memory unit 2 and data processing unit 3 on the same semiconductor chip 1 so that the memory unit 2 is disposed on one portion of the semiconductor chip 1 (on the right of FIG. 2), while the data processing unit 3 is disposed on the other portion thereof (on the left of FIG. 2), with a plurality of input pads 4 aligned in the central portion of the semiconductor chip 1 lying between the portion in which the memory unit 2 is disposed and the portion in which the data processing unit 3 is disposed. In the case where a plurality of memory units 2 are used, they are aligned on one portion (e.g., on the right of FIG. 2) of the semiconductor chip 1.

Figure 3A:
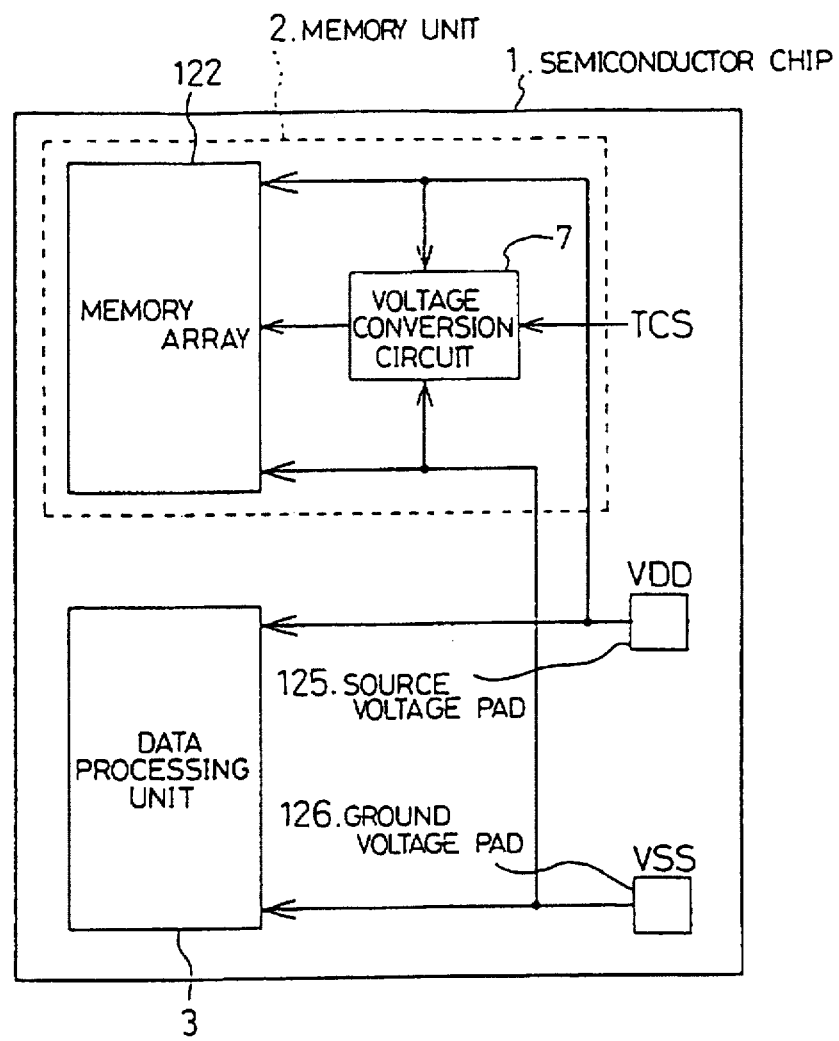
FIG. 3(a) is a block diagram showing an example of a circuit for supplying a specified voltage to a memory array and data processing unit in the DRAM of the first embodiment.

FIG. 3(a) exclusively shows one memory unit 2, the data processing unit 3, and a circuit for supplying a specified voltage to these component from the outside, which are provided in the DRAM of the present embodiment shown in FIG. 1.

In FIG. 3(a), a memory array 122 constituting the memory core of the memory unit 2 and the data processing unit 3 are provided on the same semiconductor chip 1. On the semiconductor chip 1 are also provided: the voltage conversion circuit 7; a source voltage pad 125 for supplying a source voltage VDD to the memory array 122 and data processing unit 3; and a ground voltage pad 126 for supplying a ground voltage VSS to the memory array 122 and data processing unit 3. The voltage conversion circuit 7 receives the source voltage VDD from the source voltage pad 125 and the ground voltage VSS from the ground voltage pad 126 and generates, e.g., a reference voltage or a ½ source voltage.

Figure 3B:
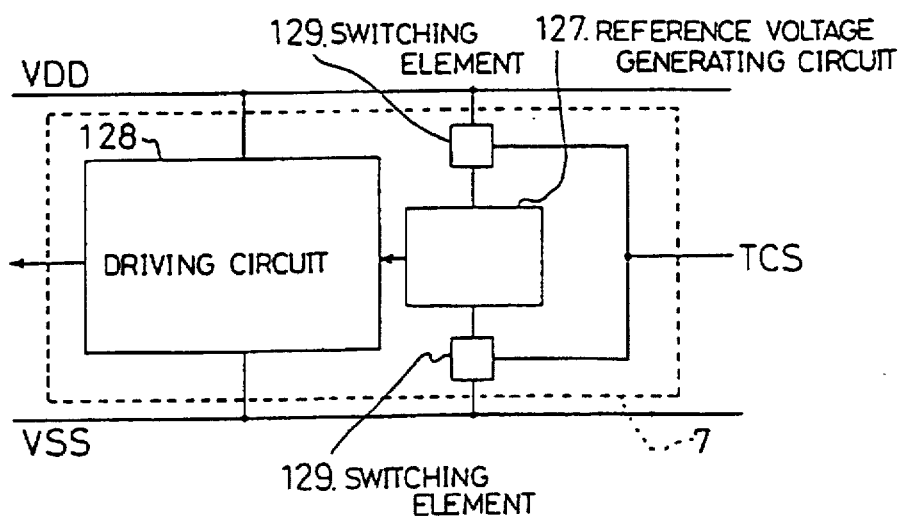
FIG. 3(b) is a block diagram showing the structure of a voltage converting circuit in the circuit of FIG. 3(a)
Figure 4:
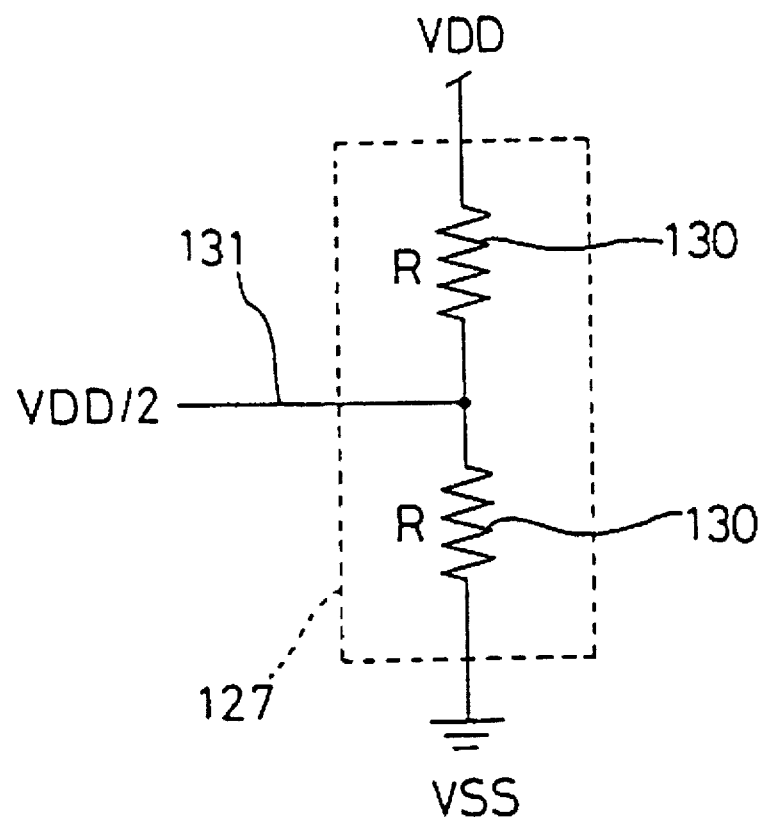
FIG. 4 is a circuit diagram showing the structure of a reference voltage generating circuit in the voltage converting circuit of FIG. 3(b)

FIG. 3(b) is a block diagram showing the structure of the voltage conversion circuit 7. As shown in FIG. 3(b), the voltage conversion circuit 7 consists of: a reference voltage generating circuit 127 serving as a memory array supply voltage generating circuit; a driving circuit 128; and a switching element 129 serving as a means for cutting off a current which is brought into the non-conducting state by activating a test control signal TCS. As shown in FIG. 4, the simplest embodiment of the reference voltage generating circuit 127 is composed of a resistance 130. FIG. 4 shows a circuit in an ordinary state in which the switching element 129 is conducting. In this case, a current is allowed to flow from the source voltage pad 125 through the resistance 130 to the ground voltage pad 126, thereby dividing the source voltage VDD and generating a voltage VDD/2 at an output node 131.

In a DRAM in which the memory array and data processing unit are mounted together, a current flowing from the source voltage pad 125 through the reference voltage generating circuit 127 to the ground voltage pad 126 in inspecting a source current during standby is larger than a source current flowing through the data processing unit 3 on standby by two to three orders of magnitude. Consequently, a source current failure in the data processing unit 3 on standby is disadvantageously hidden by the source current flowing through the memory array 122 on standby.

In the present embodiment, however, the switching elements 129 are interposed between the source voltage pad 125 and the reference voltage generating circuit 127 of the voltage conversion circuit 7 and between the ground voltage pad 126 and the reference voltage generating circuit 127 of the voltage conversion circuit 7, so as to overcome the above disadvantage.

In the case of inspecting the source current flowing through the memory array 122 on standby, the test control signal TCS is inactivated so as to measure the current with the switching elements 129 in the conducting state.

In the case of inspecting the source current flowing through the data processing unit 3 on standby, on the other hand, the test control signal TCS is activated so as to measure the current with the switching elements 129 in the nonconducting state. As a result, since the current is not allowed to flow from the source voltage pad 125 to the ground voltage pad 126, a source current failure in the data processing unit 3 on standby can be detected.

Although the switching elements 129 are provided between the source voltage pad 125 and the reference voltage generating circuit 127 of the voltage conversion circuit 7 and between the ground voltage pad 126 and the reference voltage generating circuit 127 of the voltage conversion circuit 7, a similar effect can be obtained if either of the switching elements 129 is solely provided.

Figure 5A:
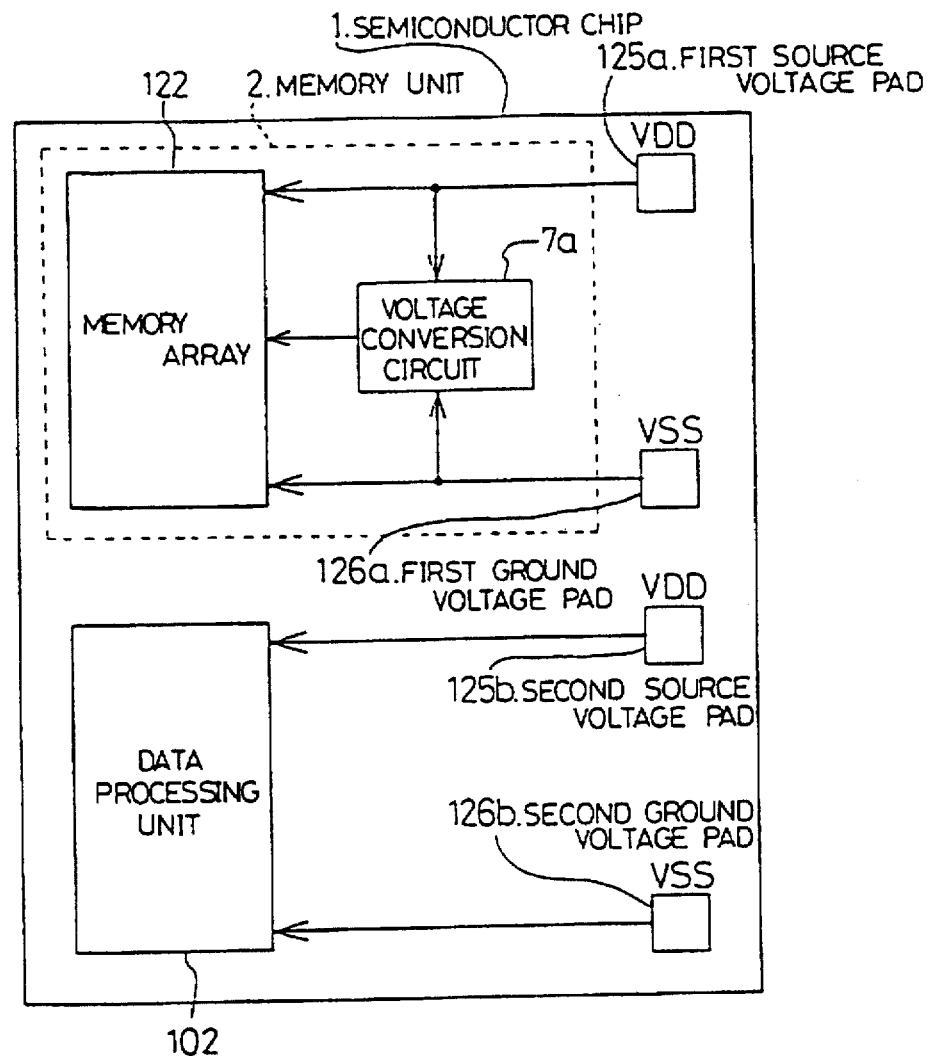
FIG. 5(a) is a block diagram showing another example of the circuit for supplying a specified voltage to the memory array and data processing unit in the DRAM of the first embodiment.

FIG. 5(a) shows another example of the circuit for supplying a specified voltage to the memory array 122 of the memory unit 2 and to the data processing unit 3.

In FIG. 5(a), the memory array 122, constituting the memory core of the memory unit 2, and the data processing unit 3 are provided on the same semiconductor chip 1. On the semiconductor chip 1 are also provided: the voltage conversion circuit 7a; a first source voltage pad 125a for supplying the source voltage VDD to the memory array 122; a first ground voltage pad 126a for supplying the ground voltage VSS to the memory array 122; a second source voltage pad 125b for supplying the source voltage VDD to the data processing unit 3; and a second ground voltage pad 126b for supplying the ground voltage VSS to the data processing unit 3. The voltage conversion circuit 7a receives the source voltage VDD and the ground voltage VSS from the first source voltage pad 125a and from the first ground voltage pad 126a, respectively, and generates, e.g., the reference voltage and ½ source voltage.

Figure 5B:
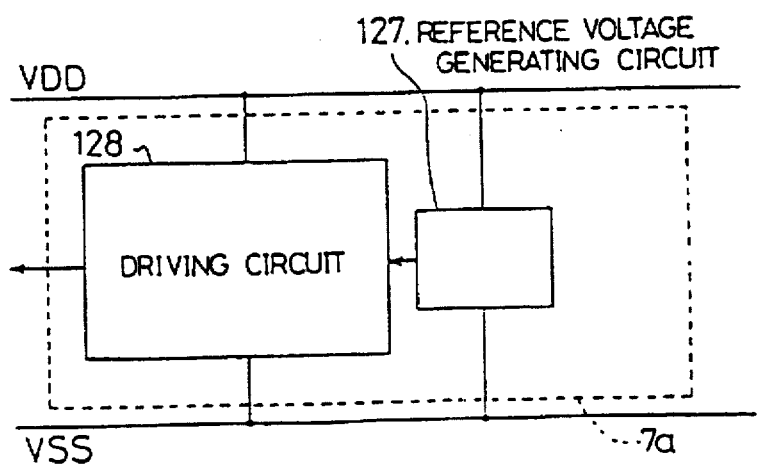
FIG. 5(b) is a block diagram showing the structure of the voltage converting circuit in the circuit of FIG. 5(a)

FIG. 5(b) is a block diagram showing the structure of the voltage conversion circuit 7a. As shown in FIG. 5(b), the voltage conversion circuit 7a consists of: the reference voltage generating circuit 127 serving as the memory array supply voltage generating circuit; and the driving circuit 128. The reference voltage generating circuit 127 used here is the same as the reference voltage generating circuit shown in FIG. 4.

In the present embodiment, the first source voltage pad 125a connected to the memory array 122 and to the voltage conversion circuit 7a is physically separated from the second source voltage pad 125b connected to the data processing unit 3, while the first ground voltage pad 126a connected to the memory array 122 and to the voltage conversion circuit 7a is physically separated from the second ground voltage pad 126b connected to the data processing unit 3. Consequently, a current is allowed to flow from the first source voltage pad 125a through the reference voltage generating circuit 127 to the first ground voltage pad 126a and does not affect a current flowing from the second source voltage pad 125b through the data processing unit 3 to the second ground voltage pad 126b. As a result, in the case of inspecting the source currents during standby, the source current flowing through the memory array 122 on standby can be measured independently of the measurement of the source current flowing through the data processing unit 3 on standby, so that a source current failure flowing through the data processing unit 3 on standby can also be detected.

According to the present embodiment, since the test control signal for controlling the switching elements as the means for cutting off a current is unnecessary, control over the chip can be simplified.

Figure 6:
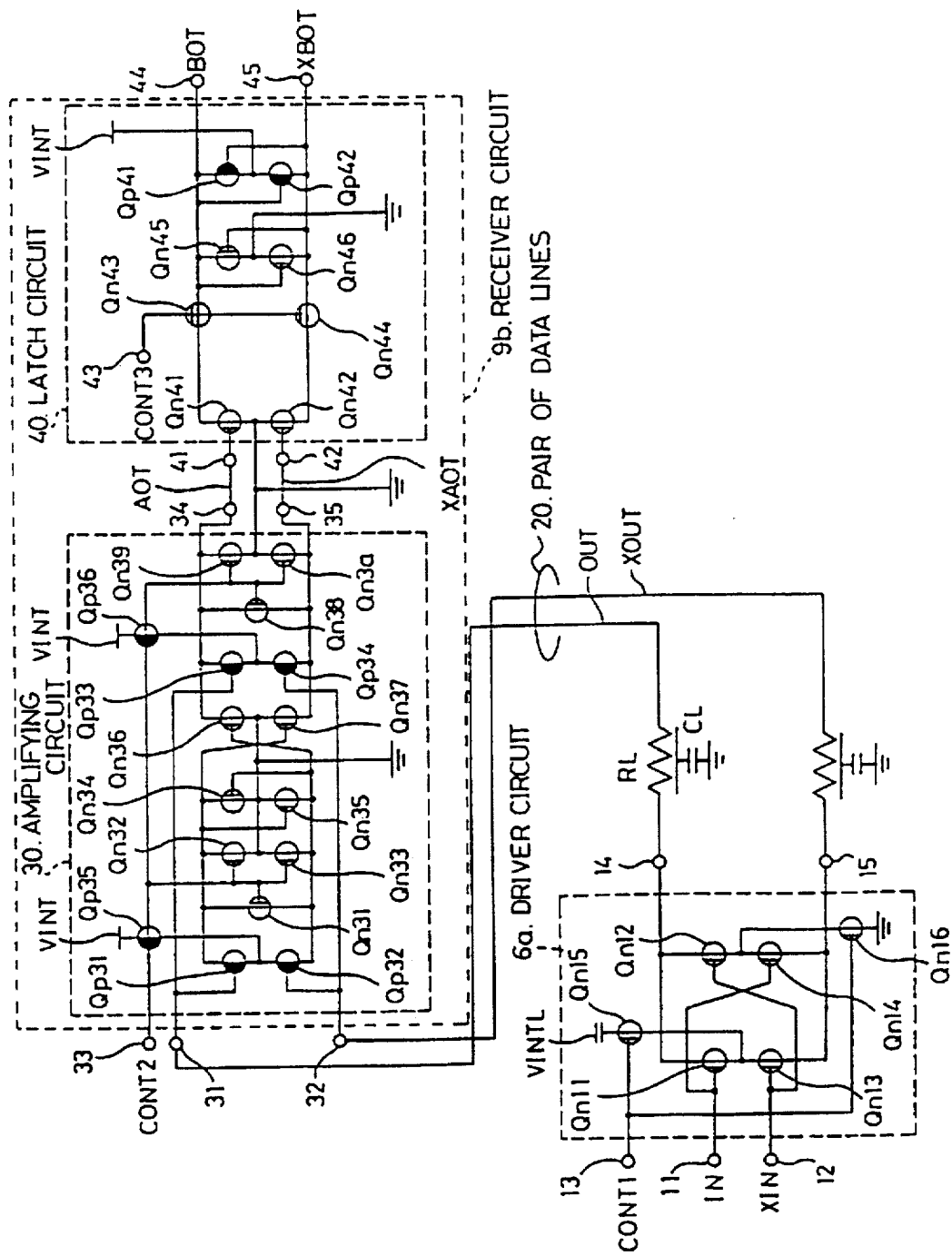
FIG. 6 is a circuit diagram showing the structure of a data transmission circuit in the DRAM of the first embodiment.
Figure 7:
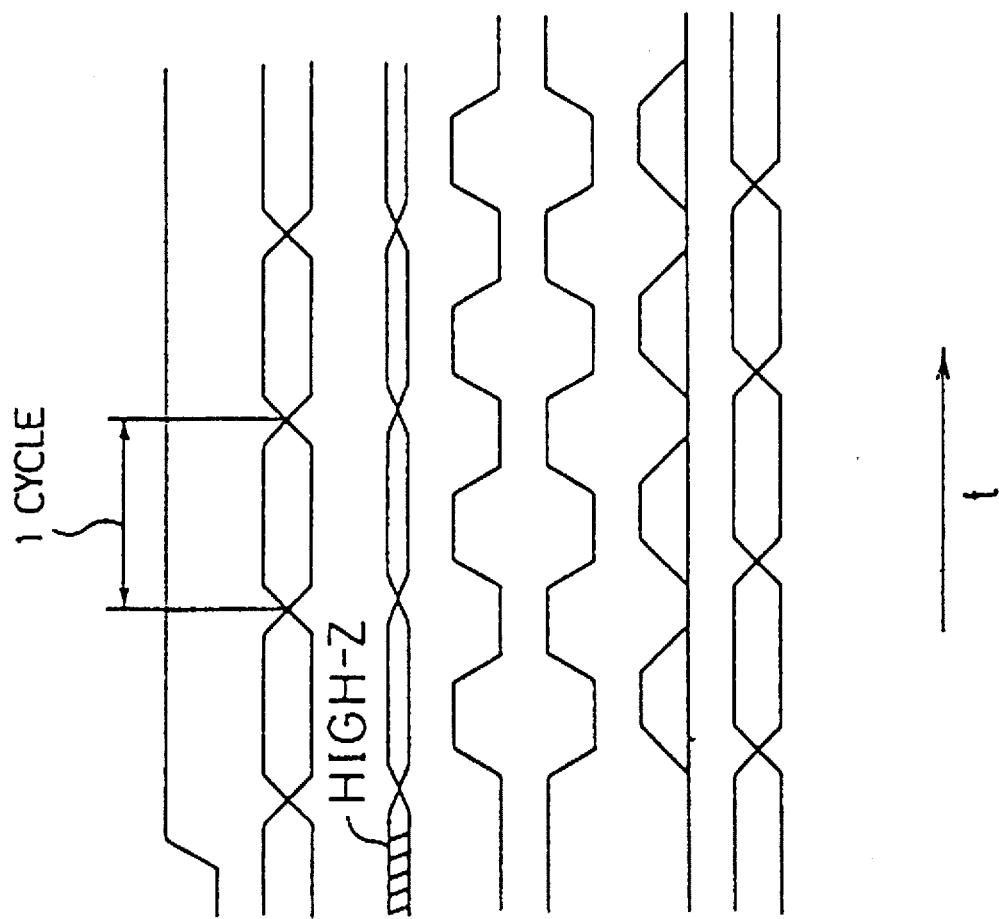
FIGS. 7(a), 7(b), 7(c), 7(d), 7(e), 7(f) and 7(g) are timing charts showing the operation of the data transmission circuit according to the first embodiment.

FIG. 6 exclusively shows the structure of the data transmission circuit provided in the DRAM of the first embodiment shown in FIG. 1. Here, a description will be given to a unilateral data transmission circuit consisting of: the driver circuit 6a in the memory unit 2; the receiver circuit 9a in the data processing unit 3; and a pair of data lines connecting the above two circuits. As for a data transmission circuit consisting of: the driver circuit 9a in the data processing unit 3; the receiver circuit 6b in the memory unit 2; and a pair of data lines connecting these circuits, it is similar to the data transmission circuit mentioned above. The data bus 10 shown in FIG. 1 is composed of the above two pairs of data lines.

In FIG. 6, a reference numeral 6a designates a driver circuit (data line driving circuit) of the memory unit 2, 20 designates a pair of data lines, 30 designates an amplifying circuit, and 40 designates a latch circuit. The amplifying circuit 30 and latch circuit 40 constitute the receiver circuit 9b of the data processing unit 3. Here, VINT designates a first reduced voltage and VINTL designates a second reduced voltage, which is lower than the first reduced voltage VINT. VINT and VINTL are each generated from an external source voltage VCC by voltage reducing circuits (not shown). For example, VCC=3.3 V, VINT=2.5 V, and VINTL=0.6 V.

The driver circuit 6a is for differentially driving the pair of data lines 20 by converting a pair of differential input signals IN/XIN, which swing between 0 V and VINT, to a pair of differential signals, each having a smaller amplitude, which swing between 0 V and VINTL. The driver circuit 6a comprises: a pair of differential input terminals 11 and 12 for accepting the IN/XIN; a control terminal 13 for accepting a first control signal CONT1; a pair of differential output terminals 14 and 15 connected to the pair of data lines 20; and first to sixth NMOS transistors Qn11 to Qn16. The Qn11 has its gate connected to the differential input terminal 11, which is one of the pair of differential input terminals 11 and 12, has its drain connected to the differential output terminal 14, which is one of the pair of differential output terminals 14 and 15, and its source connected to the VINTL via the Qn 15. The Qn12 has its gate connected to the other differential input terminal 12, has its drain connected to the terminal 14, and its source connected to a ground line (ground level: 0 V ) via the Qn16. The Qn13 has its gate connected to the terminal 12, its drain connected to the other differential output terminal 15, and its source connected to the VINTL via the Qn15. The Qn14 has its gate connected to the terminal 11, its drain connected to the terminal 15, and its source connected to the ground line via the Qn16. The gates of the Qn15 and Qn16 are connected in common to the control terminal 13. Each of the threshold voltages of the Qn11 to Qn14 is about 0.5 V.

The pair of data lines 20 are for transmitting the pair of differential signals which were outputted from the driver circuit 6a to the amplifying circuit 30, and each data line has a resistive component RL and a capacitive component CL as distributed constants.

The amplifying circuit 30 is for amplifying a pair of differential signals OUT/XOUT, which have been transmitted through the pair of data lines 20 and which swing between 0 V and VINTL, to a pair of differential signals AOT/XAOT which swing between 0 V and VINT. The amplifying circuit 30 comprises: a pair of differential input terminals 31 and 32 for accepting the OUT/XOUT; a control terminal 33 for accepting a second control signal CONT2; a pair of differential output terminals 34 and 35 connected to the latch circuit 40; first to sixth PMOS transistors Qp31 to Qp36; and first to tenth NMOS transistors Qn31 to Qn3a.

The latch circuit 40 is for latching the AOT/XAOT from the amplifying circuit 30 and obtaining a pair of differential output signals BOT/XBOT which swing between 0 V and VINT. The latch circuit 40 comprises: a pair of differential input terminals 41 and 42 for accepting the AOT/XAOT; a control terminal 43 for accepting a third control signal CONT3; a pair of differential output terminals 44 and 45 for outputting the BOT/XBOT; first and second PMOS transistors Qp41 and Qp42; and first to sixth NMOS transistors Qn41 to Qn46.

FIGS. 7(a) to 7(g) are timing charts showing the operation of the data transmission circuit of FIG. 6. When the CONT1 is raised to the HIGH level, a data transmission cycle is initiated. In each cycle, the IN/XIN having the amplitude VINT is converted by the driver circuit 6a to the OUT/XOUT having the smaller amplitude VINTL, which is then amplified by the amplifying circuit 30 to the AOT/XAOT having the amplitude VINT. At this point, the CONT3 is raised to the HIGH level and the AOT/XAOT is latched by the latch circuit 40, so that the BOT/XBOT are determined. After the determination of the BOT/XBOT, the CONT2 is raised to the HIGH level halting the operation of the amplifying circuit 30 in synchronization with the latching of the AOT/XAOT by the latch circuit 40.

As described above, since the voltage amplitude of the pair of data lines 20 is limited to the VINTL, a current for charging and discharging the pair of data lines 20 can be reduced according to the present embodiment. The present embodiment is particularly effective in the case where a ratio of the wiring capacitance of the pair of data lines 20 to the overall capacitance of the data transmission circuit is comparatively large.

Moreover, in the driver circuit 6a composed solely of the NMOS transistors, each of the gates of the Qn11 to Qn14 accepts the IN/XIN which swing between 0 V and VINT, while the magnitude of a voltage applied between the source and drain of each of the Qn11 to Qn14 is limited to the VINTL. Consequently, if the magnitude of a difference between the VINT and VINTL is sufficient to ensure a sufficiently large gate-source voltage in each of the Qn11 to Qn14, the driver circuit 6a operates at a high speed. Even if the lower limit of the threshold voltages of the Qn11 to Qn14 is constrained to 0.3 V to 0.6 V, a large force to drive the pair of data lines 20 can be obtained, so that high-speed data transmission can be implemented with a voltage amplitude smaller than 1.5 V without increasing a leakage current flowing in the off state.

In the amplifying circuit 30, since the signals OUT/XOUT from the differential input terminals 31 and 32 are inputted to the gates of the Qp31 to Qp34, there should be no problem if the signals make slow transitions. However, since the amplitude of the OUT/XOUT is limited to the magnitude of the VINTL, a current will constantly flow from the VINT through the Qp31 to Qp34 to the ground line. However, since the CONT2 is given to the amplifying circuit 30 so as to halt the operation of the amplifying circuit 30 in synchronization with the latching of the AOT/XAOT by the latch circuit 40, as described above, the Qp35 and Qp36 prevent the current from flowing. Moreover, since the latch circuit 40 is provided in the lower stage of the amplifying circuit 30, the output load on the amplifying circuit 30 becomes smaller and therefore the MOS transistors constituting the amplifier 30 can be reduced in size, so that the current flowing from the power source to the ground can be suppressed even when the Qp35 and Qp36 are in the on state.

It is possible to arrange the present embodiment so that the VCC is applied as it is to an intended portion of the VINT generated from the VCC. The HIGH levels of the IN/XIN, AOT/XAOT, and BOT/XBOT are preferably in the range of 1 V to 3.3 V. The HIGH level of the OUT/XOUT is preferably in the range of 0.1 V to 1.5 V.

In the driver circuit 6a, it is possible to set the threshold voltages of the Qn11 and Qn13 positioned on the power-source side at values lower than the values of the threshold voltages of the Qn12 and Qn14 on the ground side. Specifically, the threshold voltages of the Qn11 and Qn13 are set to 0 V to 0.3 V, while setting threshold voltages of the Qn12 and Qn14 are set to 0.3 V to 0.6 V. Thus, even when the threshold voltages of the Qn11 and Qn13 are set to a value lower than the conventional lower limit (0.3 V to 0.6 V), if the data transmission circuit is controlled so that the potentials of the differential input terminals 11 and 12 become 0 V during standby, leakage currents are prevented to flow through the Qn11 and Qn13 in the off state. Therefore, by setting the threshold voltages of the Qn11 and Qn13 lower than the threshold voltages of the Qn12 and Qn14, the driving forces of the Qn11 and Qn13 can further be enhanced without increasing the leakage current flowing in the off state. The gate-source voltages of the Qn11 and Qn13 inevitably become smaller than those of the Qn12 and Qn14, so that the lowering of the threshold voltages of the Qn11 and Qn13 is effective in enhancing the driving force of the driver circuit 6a.

Figure 8:
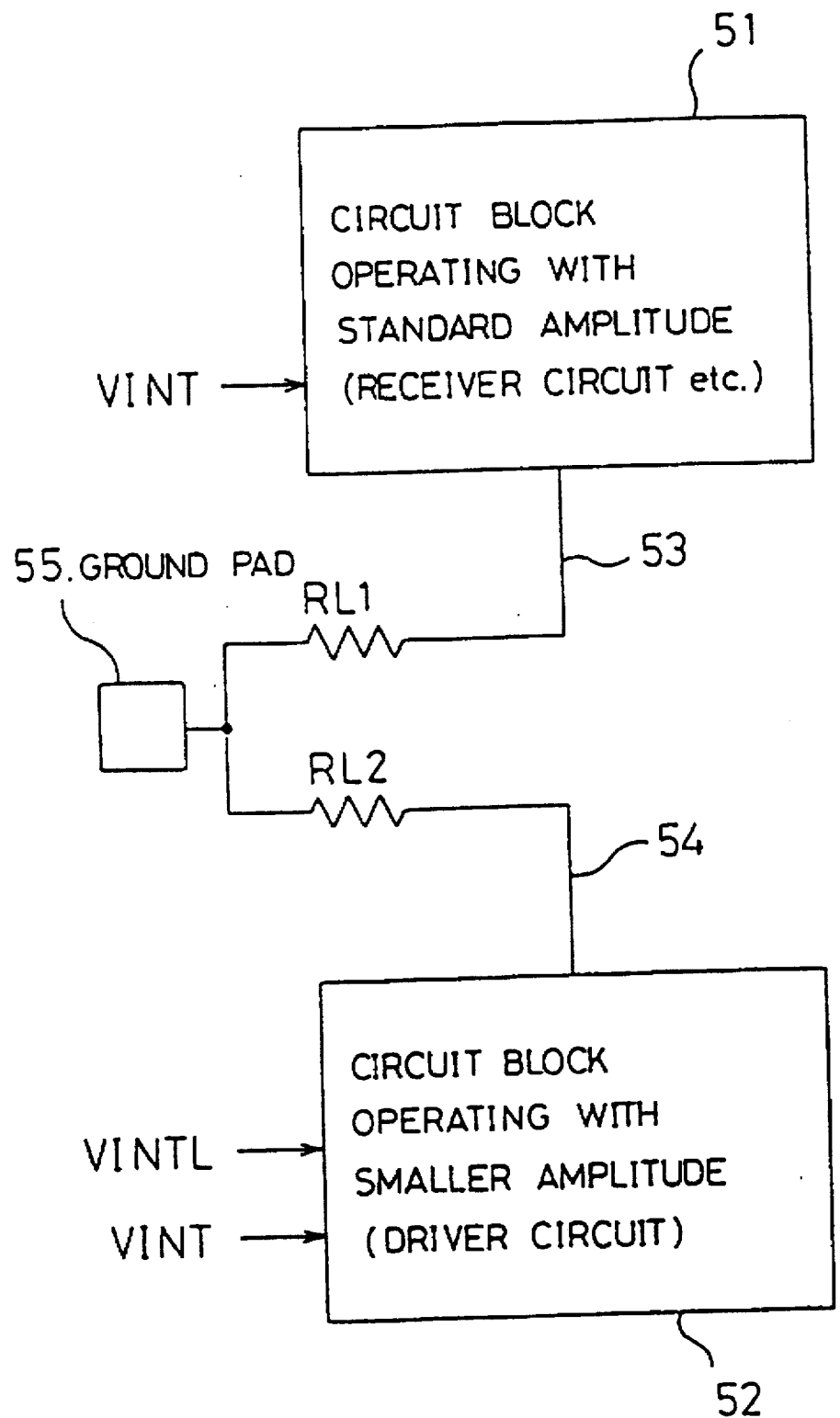
FIG. 8 is a wiring diagram showing an example of a ground line in the DRAM of the first embodiment.

FIG. 8 is a wiring diagram showing noise control over the ground line in the DRAM of the first embodiment. The noise control was achieved in view of the fact that the driver circuit 6a handles the pair of differential signals, each having the smaller amplitude, which swing between 0 V and VINTL.

In FIG. 8, a reference numeral 51 designates a first circuit block operating with the standard amplitude VINT, which includes, in addition to the amplifying circuit 30 and latch circuit 40 of the receiver circuit 9b, a timing generator and decoder circuit, and the like provided in the DRAM. A reference numeral 52 designates a second circuit block operating with the smaller amplitude VINTL. The driver circuit 6a corresponds to the second circuit block. The first circuit block 51 is connected to a ground pad 55 via a ground line 53, while the second circuit block 52 is connected to a ground pad 55 via a ground line 54 provided independently of the ground line 53 of the first circuit block 51. Here, if it is assumed that an extremely large current is allowed to flow through the ground line 53 due to the operation of the circuits in the first circuit block 51, a voltage reduction is caused by a resistive component RL1 of the ground line 53, so that the ground level of the first circuit block 51 varies to a large extent. However, since the ground line 54 is provided independently of the ground line 53 in the first circuit block 51, the driver circuit 6a in the second circuit block 52 is seldom affected by the variation in the ground level of the first circuit block 51 and can continue a proper operation. A reference numeral RL2 designates a resistive component of the ground line 54.

Thus, by adopting the ground wiring as shown in FIG. 8, the intrusion of power-source noise resulting from an operating current in the first circuit block 51 into the second circuit block 52 can be suppressed to a certain extent.

Figure 9:
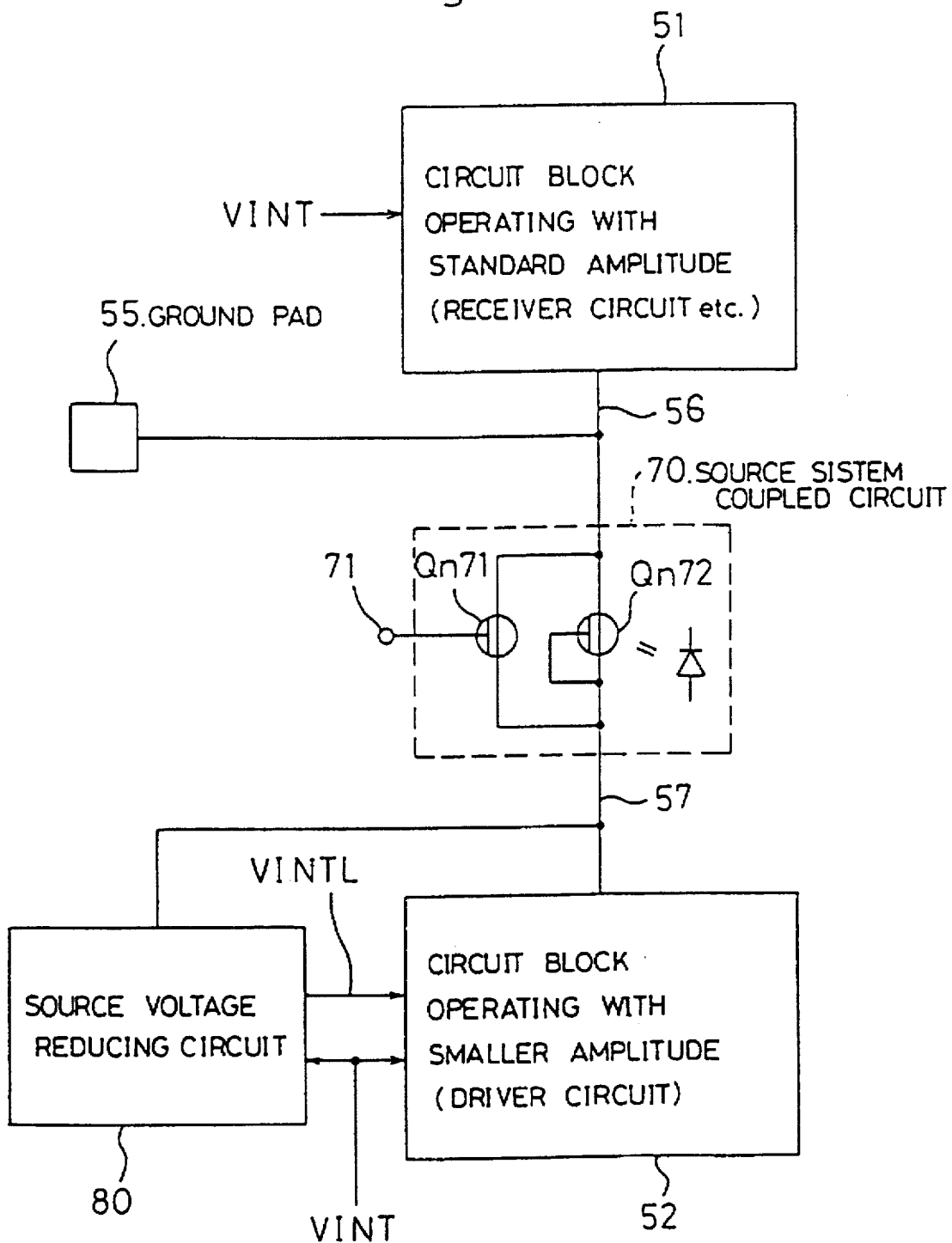
FIG. 9 is a wiring diagram showing another example of the ground line in the DRAM of the first embodiment.

FIG. 9 is a wiring diagram showing another example of the noise control over a ground line. The wiring of the ground line of FIG. 9 was also installed under the noise control in view of the fact that the driver circuit 6a handles the pair of differential signals, each having the smaller amplitude, similarly to the case shown in FIG. 8. The first and second circuit blocks 51 and 52 shown in FIG. 9 are the same as those shown in FIG. 8. The ground line is divided into a first ground line 56 for the first circuit block 51 (ground line of main source wiring system) and a second ground line 57 for the second circuit block 52 (ground line of subordinate source wiring system). The first ground line 56 is connected to the ground pad 55, while the second ground line 57 is connected to the first ground line 56 via a source-system coupled circuit 70. A reference numeral 80 designates a source voltage reducing circuit for supplying the VINTL to the second circuit block 52.

The source-system coupled circuit 70 is for coupling the first ground line 56 to the second ground line 57 so as to prevent the noise propagation from the first circuit block 51 to the second circuit block 52. The source-system coupled circuit 70 comprises first and second NMOS transistors Qn71 and Qn72 connected in parallel to each other. The gate of the Qn71 is supplied with a control clock via a control terminal 71. On the other hand, the gate of the Qn72 is connected to the second ground line 57 so that the Qn72 functions as a MOS diode.

Of the two NMOS transistors constituting the source-system coupled circuit 70, the Qn71 connects the first ground line 56 to the second ground line 57 with a low impedance if it is turned on by the control clock supplied via the control terminal 71 during the standby of the DRAM. During the operation of the DRAM, i.e., while the Qn71 is in the off state, the Qn72 functions as a MOS diode so as not to transmit, to the second ground line 57, the raised level of the ground voltage in the first ground line 56 which accompanies the operation of the first circuit block 51.

As described above, the driver circuit 6a handles the pair of differential signals, each having the smaller amplitude, which swing between 0 V (ground level) and VINTL. The VINTL is a small voltage of the order of 0.6 V. Consequently, if the potential of the second ground line 57 is raised only slightly, a malfunction may occur in the driver circuit 6a of the second circuit block 52. According to the present embodiment, however, it has become possible to effectively prevent the power-source noise resulting from the operating current in the first circuit block 51 from intruding into the second circuit block 52, so that the malfunction of the driver circuit 6a in the second circuit block 2 can be prevented.

Preferably, the threshold voltage of the Qn72 serving as a MOS diode is minimized to 0 V or less.

Figure 10:
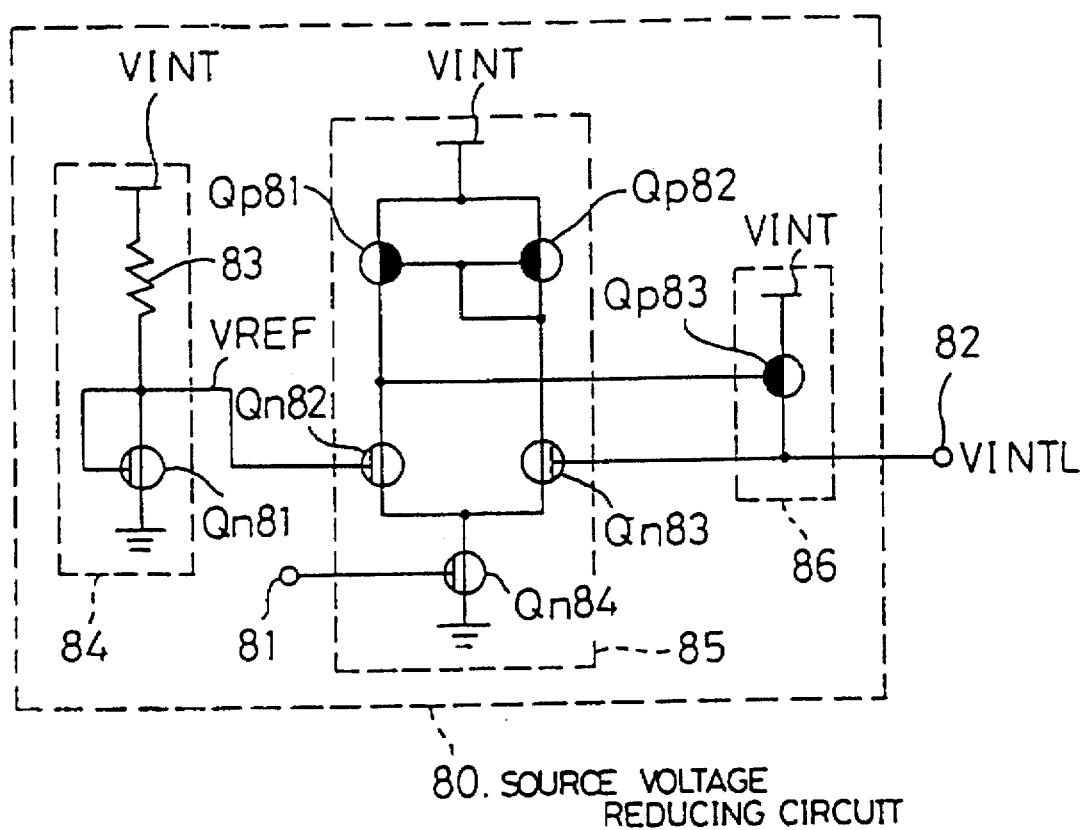
FIG. 10 is a circuit diagram showing the structure of a source voltage reducing circuit.

FIG. 10 is a circuit diagram showing the internal structure of the source voltage reducing circuit 80 shown in FIG. 9. The source voltage reducing circuit 80 is for generating the VINTL from the VINT which was generated from the VCC by another source voltage reducing circuit (not shown). The source voltage reducing circuit 80 comprises: a control terminal 81 for accepting a control clock; an output terminal 82 for outputting the VINTL; a resistor 83; first to third PMOS transistors Qp81 to Qp83; and first to fourth NMOS transistors Qn81 to Qn84.

The resistor 83 and Qn81, which are connected in series to each other, constitute a reference potential generating circuit 84 for generating a potential VREF to be used as a reference for the VINTL. The reference potential generating circuit 84 utilizes the threshold voltage of the Qn81. As shown in FIG. 9, at least the ground potential of the reference potential generating circuit 84 is obtained through the second ground line 57.

The Qp81, Qp82, and Qn82 to Qn84 constitute a comparing circuit 85 for comparing the VINTL with the VREF. The Qp81 and Qp82 are connected to the VINT so as to constitute a power source Of parallel-current-mirror type. The Qn82 and Qn83 are connected on the ground side of the power source constituted by the Qp81 and Qp82. The VREF is applied to the gate of the Qn82 and the gate of the Qn83 is connected to the VINTL, so that the Qn82 and Qn83 constitute a differential amplifier. The sources of the Qn82 and Qn83 are connected to the ground line via the Qn84 serving as a common switching element which has its gate connected to the control terminal 81. The threshold voltages of the Qn82 and Qn83 are set to low values (0 V to 0.3 V) so as to enhance the driving forces of the Qn82 and Qn83, as the Qn11 and Qn13 in the above driver circuit.

The Qp83 constitutes an output circuit 86 for outputting the VINTL to the output terminal 82 and is designed so that the potential at the connection between the Qp81 and Qn82 is applied to its gate.

With the structure shown in FIGS. 9 and 10, even if the potential of the second ground line 57 should vary, the output VREF of the reference potential generating circuit 84 varies in response to the potential variation, so that the voltage between the output terminal 82 of the source voltage reducing circuit 80 and the second ground line 57 is maintained at a fixed value VINTL, thereby preventing the malfunction of the driver circuit in the second circuit block 52. Moreover, since the threshold voltages of the Qn82 and Qn83 in the comparing circuit 85 are set to low values so as to enhance the driving forces of the Qn82 and Qn83, even when the levels of the VREF and VINTL are low, a proper operation is ensured for the comparing circuit 85 as well as an excellent performance is ensured for the source voltage reducing circuit 80.

Although the VINTL was generated from the VINT in the structure of FIG. 10, it is possible to generate the VINTL directly from the VCC.

Second Embodiment

Below, a second embodiment of the present invention will be described with reference to the drawings.

Figure 11:
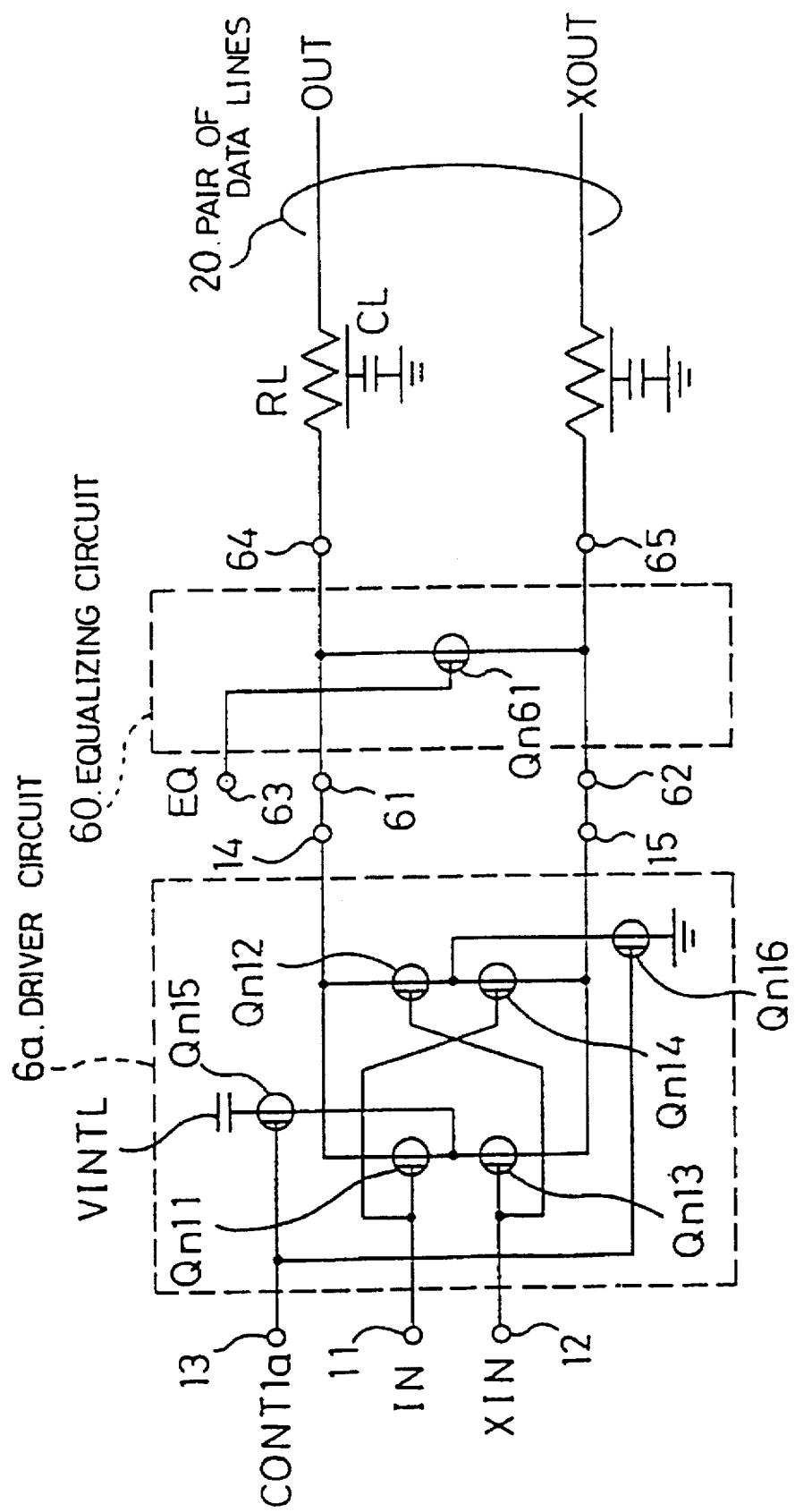

FIG. 11 is a circuit diagram partially showing a data transmission circuit in a DRAM according to the second embodiment. The data transmission circuit of the second embodiment was obtained by further providing an equalizing circuit 60 between the driver circuit 6a and pair of data lines 20 in the data transmission circuit of the DRAM according to the first embodiment.

In FIG. 11, the internal structure of the driver circuit 6a is the same as that of the first embodiment (see FIG. 6). However, a first control signal CONT1a to be applied to the control terminal 13 in the present embodiment is different from the CONT1 used in the first embodiment in that the CONT1a is maintained at the HIGH level only in the former half of each data transmission cycle.

The equalizing circuit 60 is for equalizing the potentials of the pair of data lines 20. The equalizing circuit 60 comprises: a pair of differential input terminals 61 and 62 connected to the differential output terminals 14 and 15 of the driver circuit 6a; a control terminal 63 for accepting an equalize control signal EQ; a pair of differential output terminals 64 and 65 connected to the pair of data lines 20; and an NMOS transistor Qn61. The Qn61 is interposed between the differential output terminals 64 and 65 so as to equalize the potentials of the pair of data lines 20 and is designed so that the EQ is applied to its gate.

Although an amplifying circuit and a latch circuit, which are the same as those used in the first embodiment, are connected in the lower stage of the pair of data lines 20, thereby constituting the whole data transmission circuit of the present embodiment, the drawing of the amplifying and latch circuits is omitted here.

FIGS. 12(a) to 12(h) are timing charts showing the operation of the data transmission circuit of the present embodiment. In the former half of each data transmission cycle, the CONT1a and CONT3 are raised to the HIGH levels so that the IN/XIN, having the amplitude VINT, are converted by the driver circuit 6a to the OUT/XOUT, having the smaller amplitude VINTL, which are then amplified by the amplifying circuit 30 to the AOT/XAOT having the amplitude VINT. The resulting AOT/XAOT are then latched by the latch circuit 40, thereby determining the BOT/XBOT. After the determination of the BOT/XBOT, in the latter half of the data transmission cycle, the CONT 2 and EQ are raised to the HIGH levels. Consequently, the operation of the amplifying circuit 30 is halted in synchronization with the latching of the AOT/XAOT by the latch circuit 40, while the potentials OUT/XOUT of the pair of data lines 20 are equalized by the Qn61 of the equalizing circuit 60.

According to the present embodiment, the time required for a potential difference between the pair of data lines 20 to reach a specified value is reduced due to the equalization of the pair of data lines 20, which implements data transmission at a higher speed. Moreover, since the equalizing operation is performed in the latter half of the data transmission cycle, the access speed is free from an adverse effect.

Although the NMOS transistor Qn61 for equalization is interposed between the differential output terminals 14 and 15 of the driver circuit 6a and the pair of data lines 20 in the present embodiment, the transistor can be disposed anywhere provided that it can equalize the potentials of the pair of data lines 20.

Below, a description will be given to a performance comparison between a conventional data transmission circuit in a DRAM and the data transmission circuits according to the above first and second embodiments.

Figure 13A:
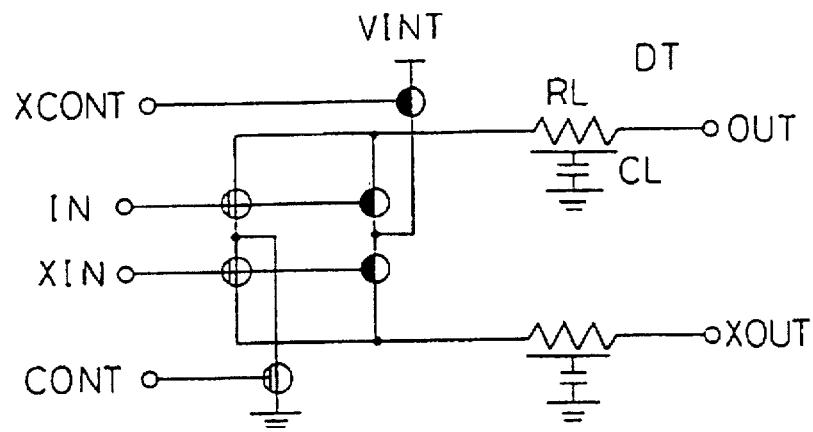
FIG. 13(a) is a circuit diagram showing a circuit to be subjected to a simulation in the data transmission circuit of a conventional DRAM.
Figure 13B:
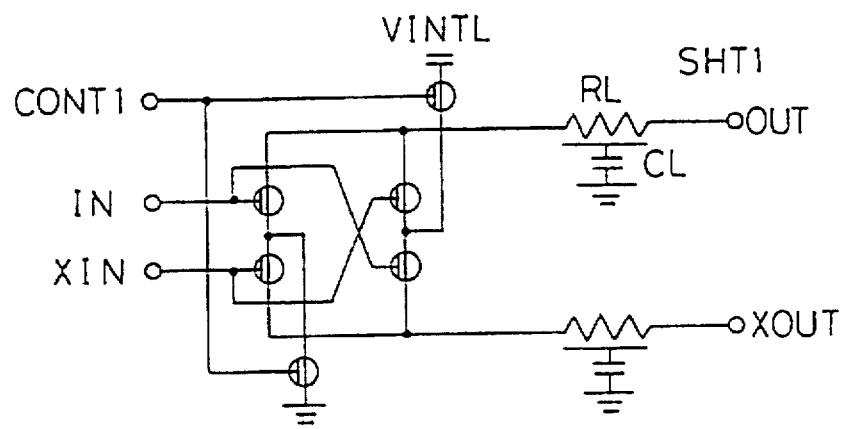
FIG. 13(b) is a circuit diagram showing a circuit to be subjected to a simulation in the data transmission circuit according to the first embodiment.
Figure 13C:
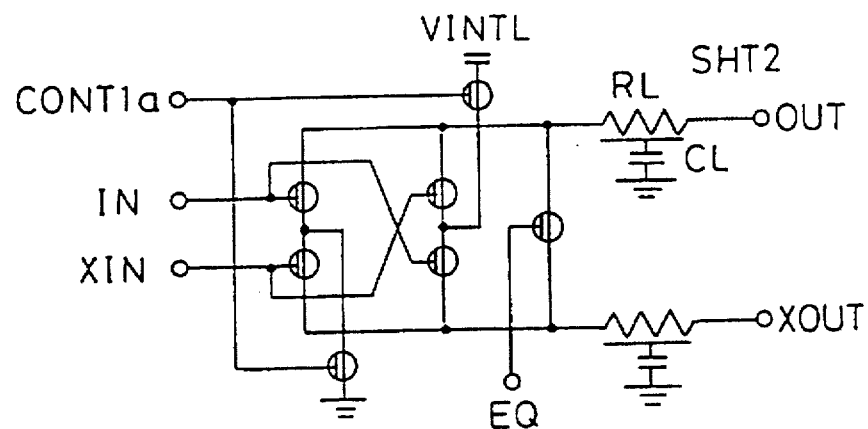
FIG. 13(c) is a circuit diagram showing a circuit to be subjected to a simulation in the data transmission circuit according to the second embodiment.

FIG. 13(a) shows a simulation circuit (DT) of a driver circuit composed of CMOS transistors in the conventional data transmission circuit. The two control signals CONT/XCONT in FIG. 13(a) are complementary to each other. FIG. 13(b) shows a simulation circuit (SHT1) corresponding to the driver circuit composed of NMOS transistors in the data transmission circuit according to the above first embodiment. FIG. 13(c) shows a simulation circuit (SHT2) corresponding to the driver circuit provided with the equalizing circuit in the data transmission circuit according to the second embodiment.

FIGS. 14(a) to 14(d) are timing charts showing conditions for a simulation using the DT, SHT1 and SHT2. In the present simulation, 16-bit data was transmitted in a cycle time $t_C$ of 20 ns under the conditions of: VINSTL=0.6 V; RL=1.8 kΩ; and CL=4.5 pF.

Figure 15:
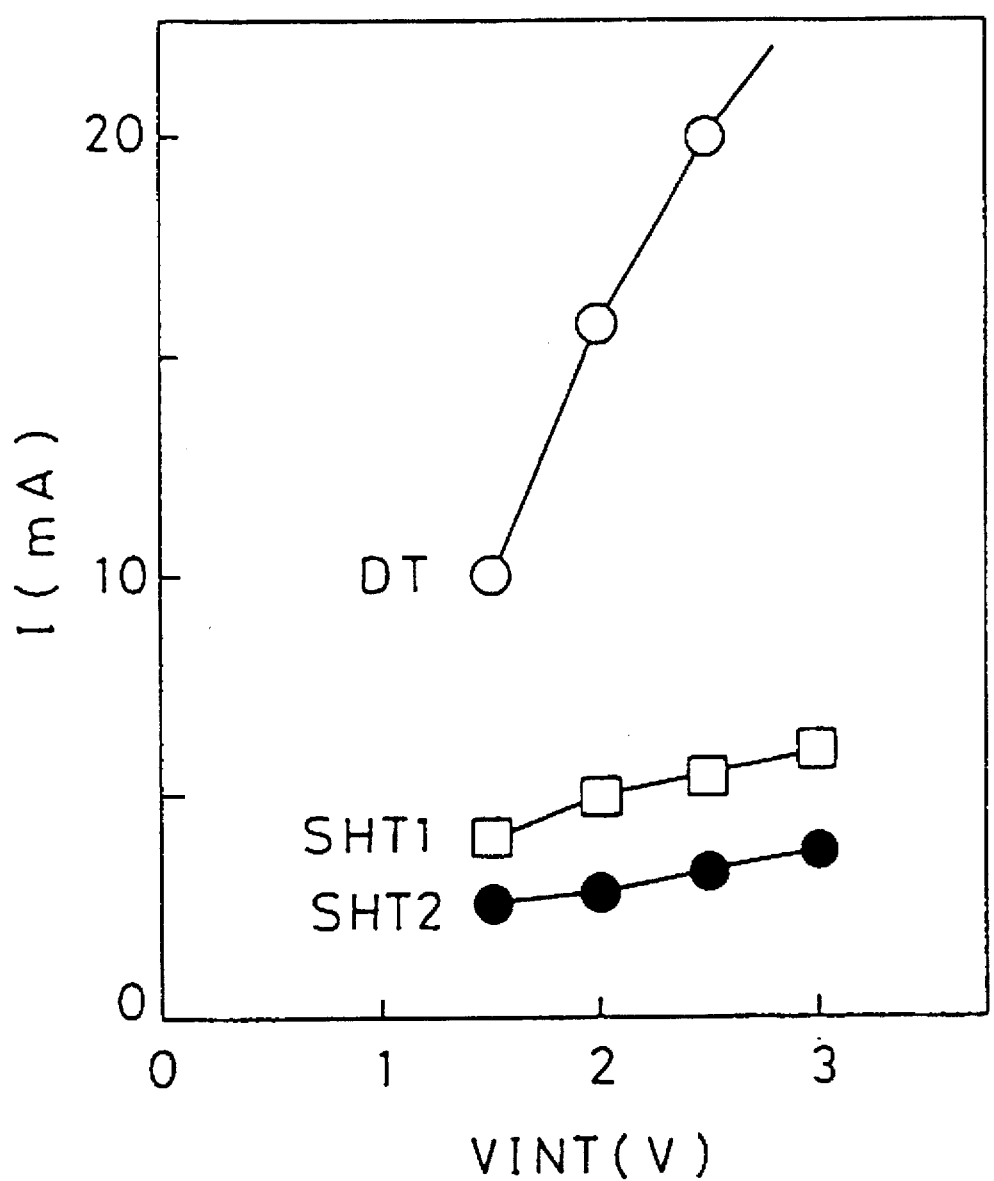
FIG. 15 is a view showing the results of a simulation on the power consumption of the circuits of FIGS. 13(a) to 13(c)

FIG. 15 is a view showing the results of a simulation on the power consumption of the DT, SHT1, and SHT2. At VINT=2.5 V, the power consumption of the SHT1 is less than the power consumption of the DT by 15 mA. The power consumption of the SHT2 is far less than the power consumption of the SHT2.

Figure 16:
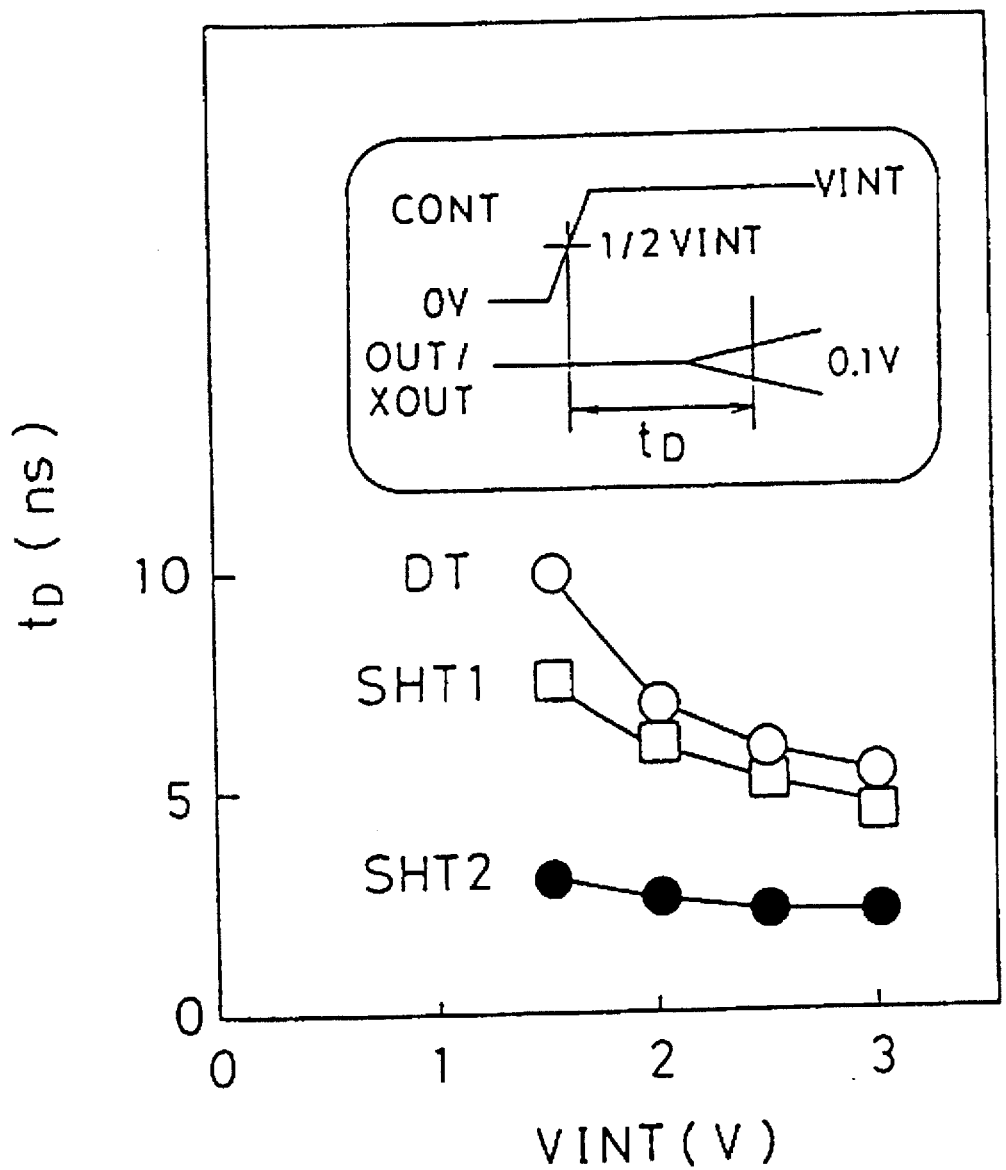
FIG. 16 is a view showing the results of a simulation on the power consumption of the circuits of FIGS. 13(a) to 13(c)

FIG. 16 is a view showing the results of a simulation on the delay time of the DT, SHT1, and SHT2. The drawing shows delay time $t_D$ in each of the DT, SHT1, and SHT2 for comparison. In the DT, the delay time $t_D$ is the time that has elapsed since the CONT/XCONT reached half the potential of the VINT till a potential difference of 0.1 V appeared as the OUT/XOUT. In the SHT1, delay time $t_D$ is the time that has elapsed since the CONT1a reached half the potential of the VINT till a potential difference of 0.1 V appeared as the OUT/XOUT. In the SHT2, the delay time $t_D$ is the time that has elapsed since the CONT1a reached half the potential of the VINT till a potential difference of 0.1 V appeared as the OUT/XOUT. It will be appreciated from the drawing that the SHT1 achieves higher-speed data transmission than the DH, and the SHT2 achieves higher-speed data transmission than the SH1.

Third Embodiment

Below, a third embodiment of the present invention will be described with reference to the drawings.

Figure 17:
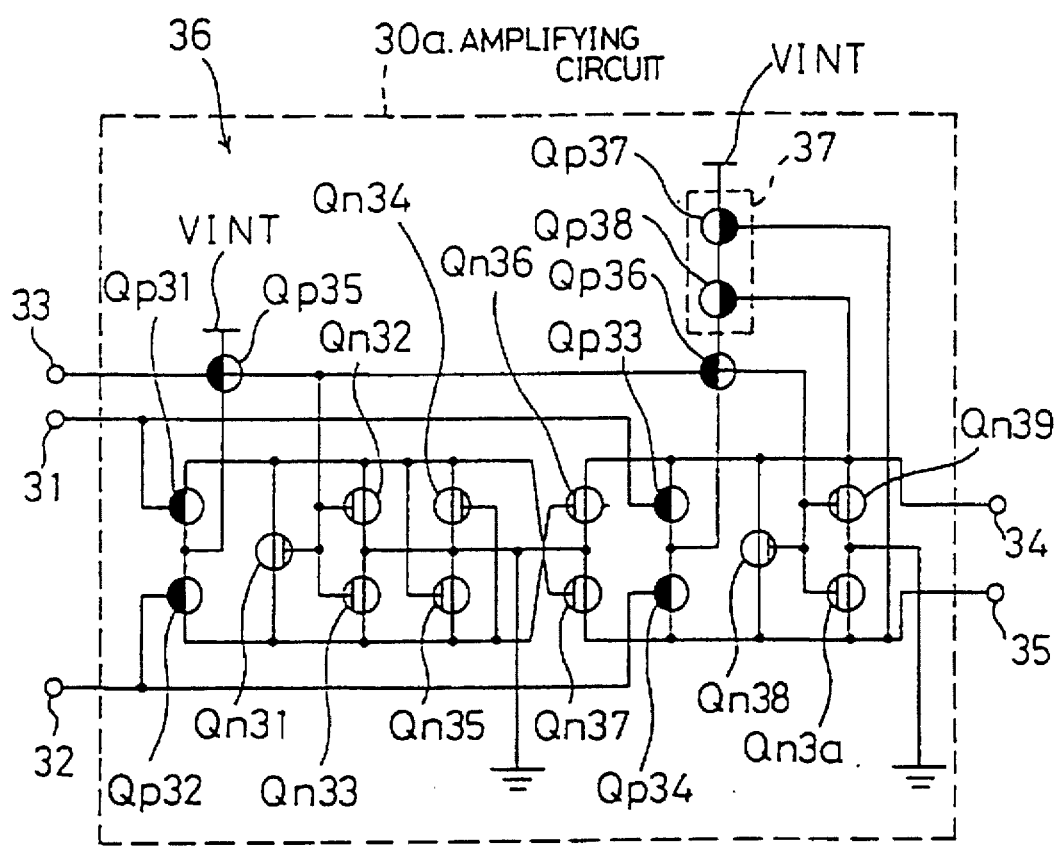
FIG. 17 is a circuit diagram showing the structure of an amplifying circuit for use in the data transmission circuit of the DRAM according to the third embodiment.
Figure 18:
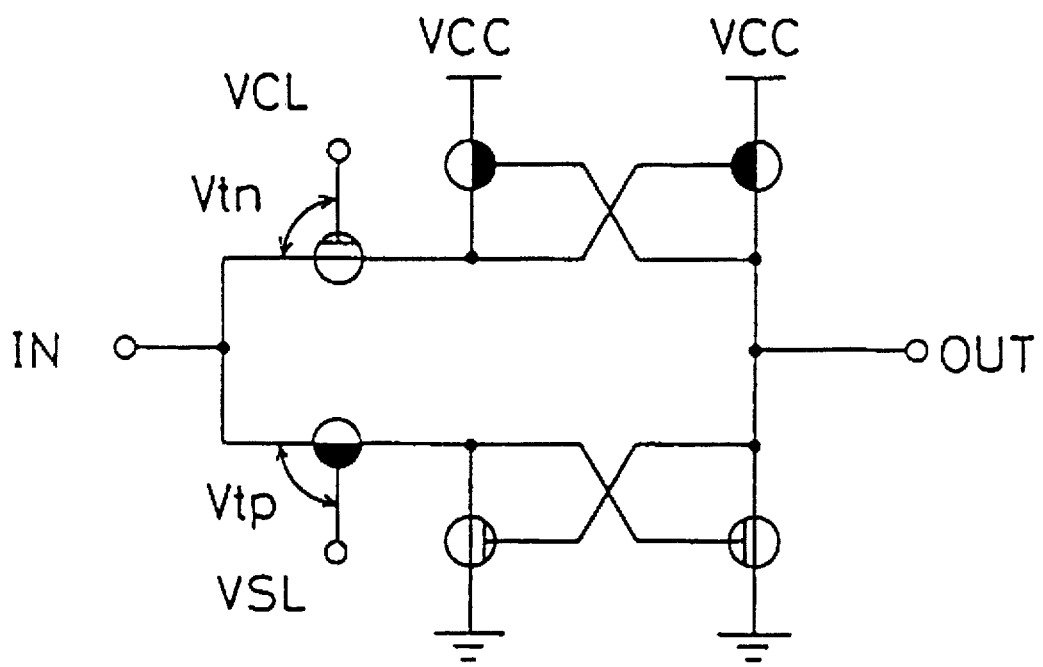
FIG. 18 is a circuit diagram showing the structure of a receiver circuit in a conventional data transmission circuit.

FIG. 17 is a circuit diagram of an amplifying circuit 30a for use in a data transmission circuit of a DRAM according to a third embodiment. The data transmission circuit according to the third embodiment was obtained by replacing the amplifying circuit 30 in the data transmission circuit of the DRAM according to the first embodiment with the amplifying circuit 30a. In the upper stage of the amplifying circuit 30a of FIG. 17 are connected a driver circuit and a pair of data lines, similarly to the case shown in the first embodiment. In the lower stage of the amplifying circuit 30a is connected a latch circuit which is the same as that used in the first embodiment, so as to constitute the whole data transmission circuit. It is possible to interpose an equalizing circuit between the driver circuit and the pair of data lines, similarly to the case shown in the second embodiment.

The structure of the amplifying circuit 30a of FIG. 17 was obtained by adding a power source controller 37 to an amplifier 36, which has the same structure as that of the amplifying circuit 30 of the first embodiment (see FIG. 6).

The power source controller 37 is that part of the circuit which controls power supply to the amplifier 36 based on outputs from the differential output terminals 34 and 35. The power source controller 37 comprises first and second PMOS transistors Qp37 and Qp38, which are connected in series to each other. The Qp37 and Qp38 are interposed between the Qp36 and the VINT for controlling power supply to that portion of the amplifier 36 composed of Qp33, Qp34, Qn38, Qn39 and Qn3a. The Qp37 has its pate connected to the terminal 35, which is one of the pair of differential output terminals 34 and 35. The Qp38 has its gate connected to the other differential output terminal 34.

The turning on and off of the Qp37 and Qp38, constituting the power source controller 37, is controlled based on the pair of differential signals, each having the amplitude VINT, at the pair of differential output terminals 34 and 35, which has been amplified by the amplifier 36. After an output of the amplifying circuit 30a and an output of the latch circuit in its lower stage were determined, when the CONT2 on the HIGH level is inputted to the control terminal 33 so as to halt the operation of the amplifying circuit 30a, either of the differential output terminals 34 and 35 reaches a potential substantially equal to the VINT, so that either of the Qp37 and Qp38 is inevitably turned off. Consequently, the current flowing through the Qp36 can be cut off completely, so that the operation of the amplifier 36 is surely halted. While the amplifier 36 is operating, each of the Qp37 and Qp38 is turned on due to the equalization of the potentials of the differential output terminals 34 and 35.

The amplifying circuit 30a of the present embodiment is effective in reducing power consumption even in the case where the turning off of the Qp36 is delayed, since the amplifying circuit 30a is automatically halted if outputs from the differential output terminals 34 and 35 are determined to a certain extent.

In the present embodiment, a PMOS transistor for feedback, is not interposed between the Qp35 and the VINT for controlling power supply to that portion of the amplifier 36 composed of Qp31, Qp32 and Qn31 to Qn37 for fear that the amplifier 36 cannot follow a potential change at the differential input terminals 31 and 32. These measures have been taken in consideration of the case where a faulty signal (faulty data) is temporarily inputted to the differential input terminals 31 and 32. Since the load on that portion of the amplifier 36 composed of Qp31, Qp32 and Qn31 to Qn37 is small, a current flowing through the Qp35 is negligible. However, in the case where it is guaranteed that input data does not vary, the PMOS transistor for feedback is preferably interposed between the Qp35 and VINT.

Thus far, the DRAM serving as an example of the LSI comprising the data transmission circuit has been described. However, the present invention is not limited thereto. It is applicable to a given LSI comprising a data transmission circuit. It is also applicable to data transmission between a plurality of chips.

We claim:

1. An amplifying circuit for amplifying a pair of differential signals inside a semiconductor integrated circuit, comprising:

a pair of differential input terminals for accepting said pair of differential signals;

an amplifier for amplifying the pair of differential signals inputted via said pair of differential input terminals;

a pair of differential output terminals for outputting the pair of differential signals which have been amplified by said amplifier; and a power source controller for controlling current supply to said amplifier based on outputs from said pair of differential output terminals.

2. An amplifying circuit according to claim 1, wherein said power source controller comprises first and second PMOS transistors which are connected in series to each other and which are interposed between a power source line and said amplifier, wherein said first PMOS transistor has its gate connected to one of said pair of differential output terminals, and said second PMOS transistor has its gate connected to the other of said pair of differential output terminals.

* * * * *

UNITED STATES PATENT AND TRADEMARK OFFICE
CERTIFICATE OF CORRECTION

PATENT NO. : 5,719,531
DATED : February 17, 1998
INVENTOR(S) : Kotani

It is certified that error appears in the above-identified patent and that said Letters Patent is hereby corrected as shown below:

ON THE TITLE PAGE:

Item [62] related U.S. Application Data, replace "abandoned" with --Pat. No. 5,680,366--.

Signed and Sealed this

Twenty-second Day of February, 2000

Attest:

Q. TODD DICKINSON

Attesting Officer

Commissioner of Patents and Trademarks

UNITED STATES PATENT AND TRADEMARK OFFICE
Certificate

Patent No. 5,719,531                                                                 Patented: February 17, 1998

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Hironori Akamatsu, Osaka, Japan.

Signed and Sealed this Nineteenth Day of November 2002.

ROBERT J PASCAL
*Supervisory Patent Examiner*
Art Unit 2817